United States Patent
Masuda

(10) Patent No.: US 9,774,007 B2
(45) Date of Patent: Sep. 26, 2017

(54) ORGANIC LIGHT-EMITTING DEVICE AND ORGANIC DISPLAY APPARATUS

(71) Applicant: Panasonic Intellectual Property Management Co., Ltd., Osaka (JP)

(72) Inventor: Hiroyuki Masuda, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 14/950,735

(22) Filed: Nov. 24, 2015

(65) Prior Publication Data

US 2016/0190517 A1    Jun. 30, 2016

(30) Foreign Application Priority Data

Dec. 24, 2014 (JP) ................................. 2014-260331

(51) Int. Cl.
     *H01L 51/52*      (2006.01)
     *H01L 27/32*      (2006.01)

(52) U.S. Cl.
     CPC ...... *H01L 51/5268* (2013.01); *H01L 51/5259* (2013.01)

(58) Field of Classification Search
     CPC ............. H01L 51/5268; H01L 51/5259; H01L 27/3244
     See application file for complete search history.

(56) References Cited

U.S. PATENT DOCUMENTS

| | | | | |
|---|---|---|---|---|
| 2005/0019431 | A1* | 1/2005 | Modak | A01N 33/12 424/736 |
| 2006/0124924 | A1* | 6/2006 | Suh | H01L 51/002 257/40 |
| 2007/0013291 | A1* | 1/2007 | Cok | B82Y 20/00 313/501 |
| 2007/0103056 | A1* | 5/2007 | Cok | H01L 27/3213 313/503 |
| 2012/0228591 | A1* | 9/2012 | Sawabe | H01L 51/5268 257/40 |
| 2012/0256218 | A1* | 10/2012 | Kwack | H01L 51/5256 257/98 |
| 2016/0197292 | A1* | 7/2016 | Lee | H01L 51/56 257/40 |

FOREIGN PATENT DOCUMENTS

| | | |
|---|---|---|
| JP | 2006-228519 | 8/2006 |
| JP | 2006-272283 A | 10/2006 |
| JP | 2009-259656 A | 11/2009 |
| JP | 2015-191799 A | 11/2015 |

\* cited by examiner

*Primary Examiner* — Caridad Everhart
(74) *Attorney, Agent, or Firm* — Greenblum & Bernstein, P.L.C.

(57) ABSTRACT

A display panel includes a EL panel part, a CF panel part, and a resin layer. Light is extracted from a luminous part including an organic luminous layer in the EL panel part in a direction of an arrow. The resin layer is formed to cover an upper surface of the EL panel part. Transmittance of the light from the EL panel part is 80% or higher. The resin layer includes a resin part and a plurality of particles dispersed in the resin part. The particles are formed of synthetic zeolite having a refractive-index ratio to the resin part of 1.0 or more and a particle size of 2 μm or more.

8 Claims, 22 Drawing Sheets

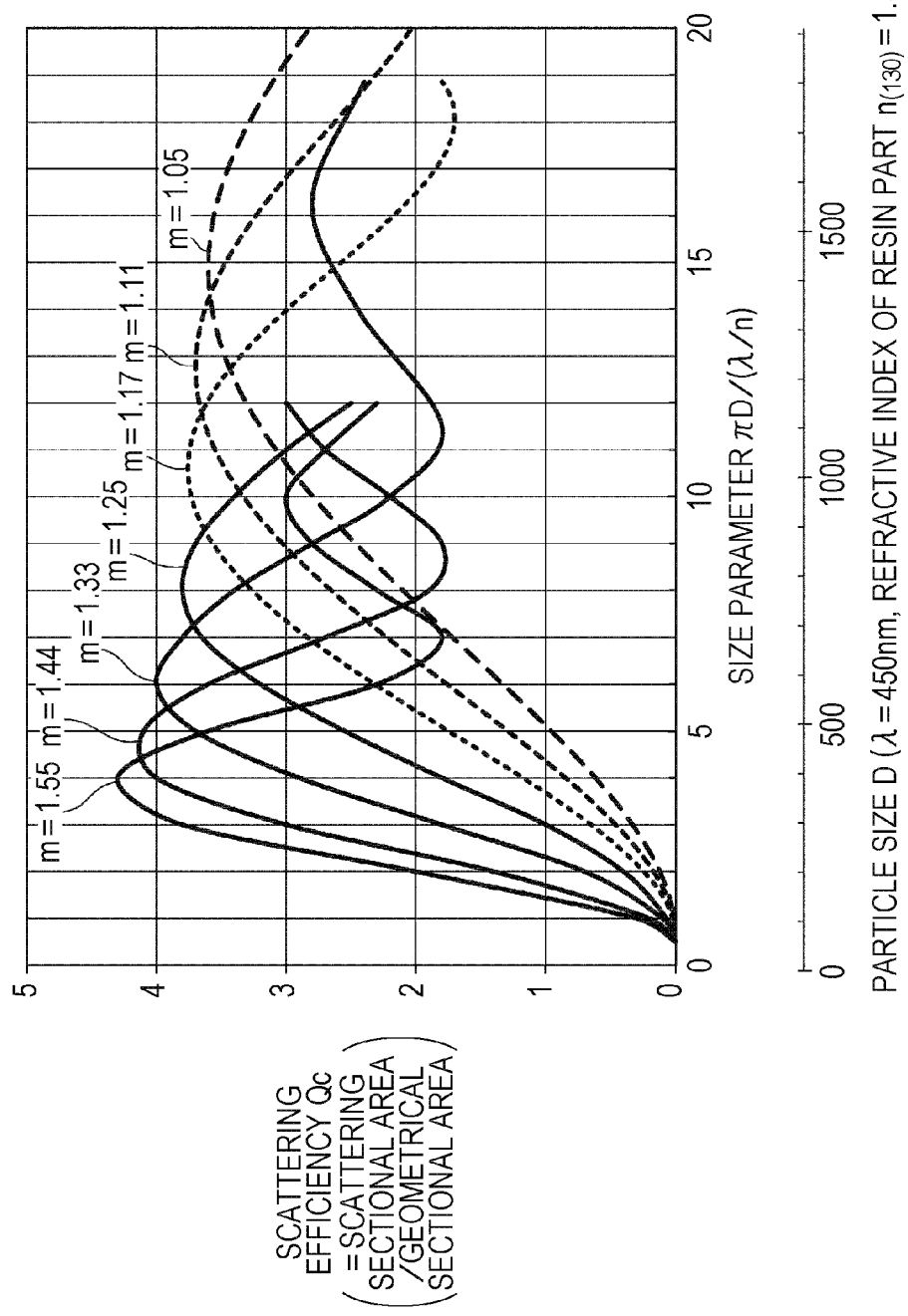

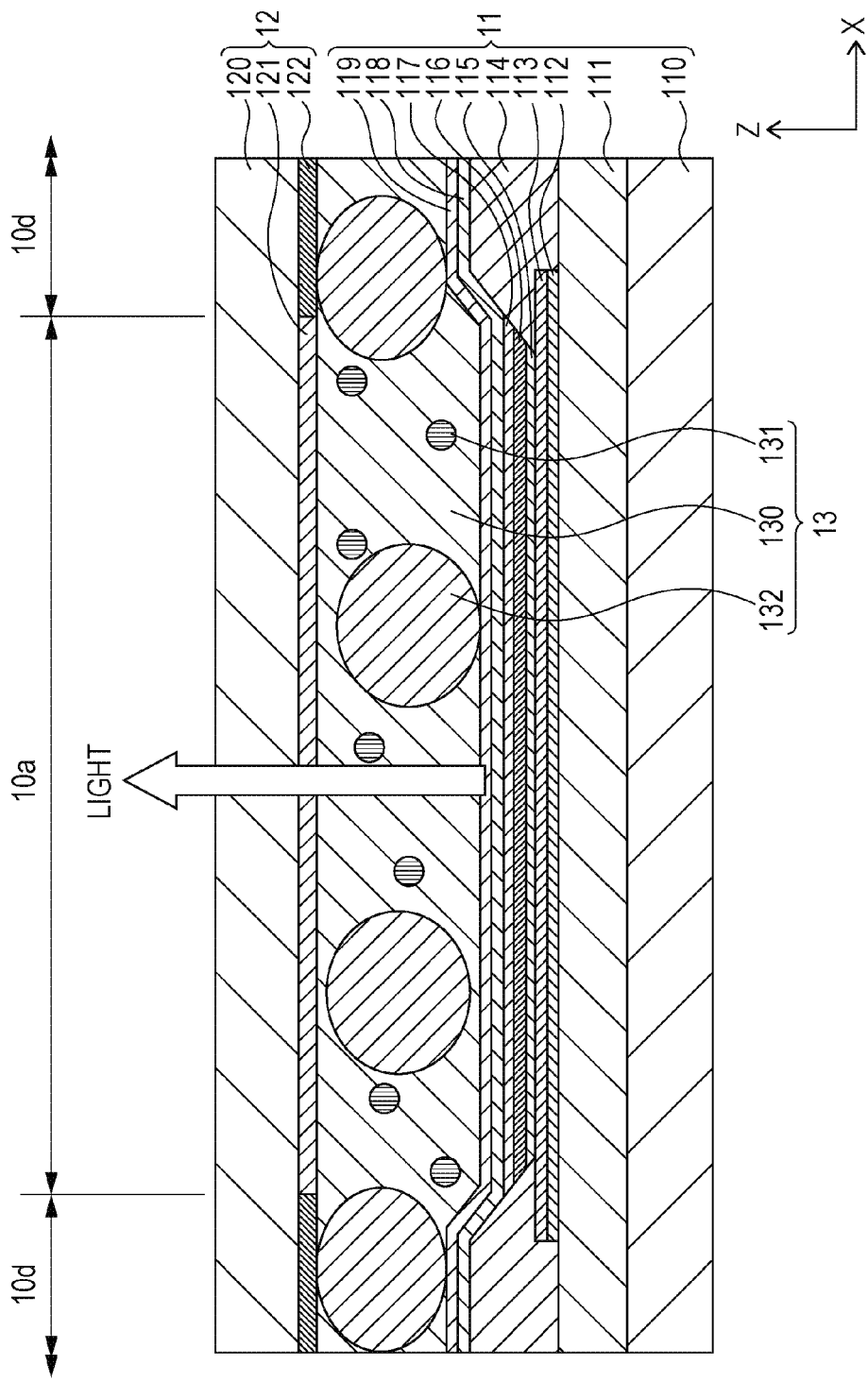

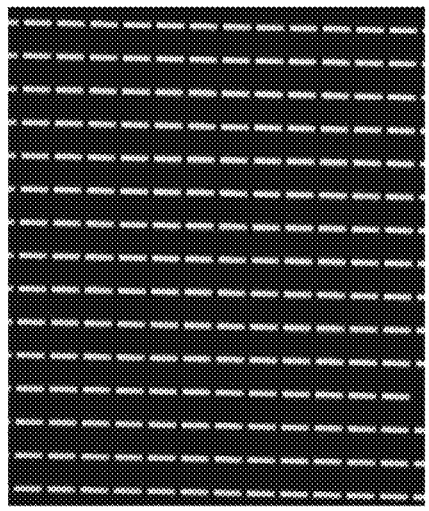
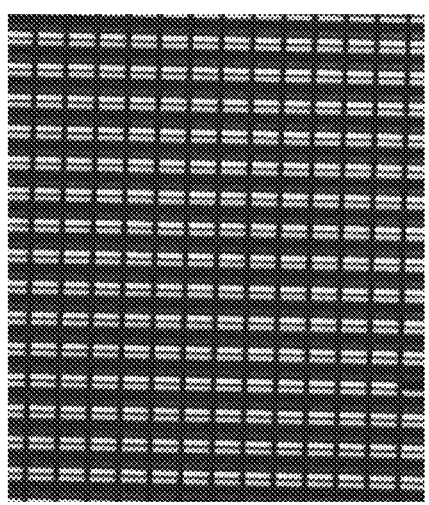
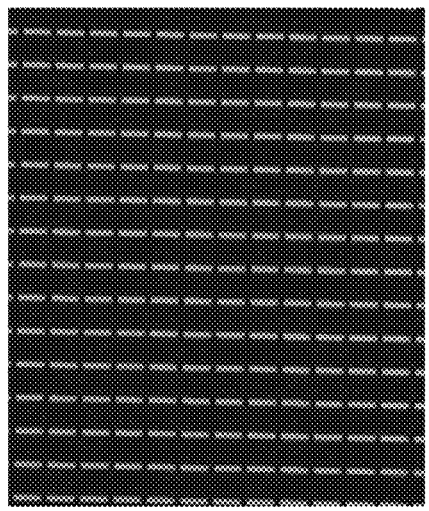
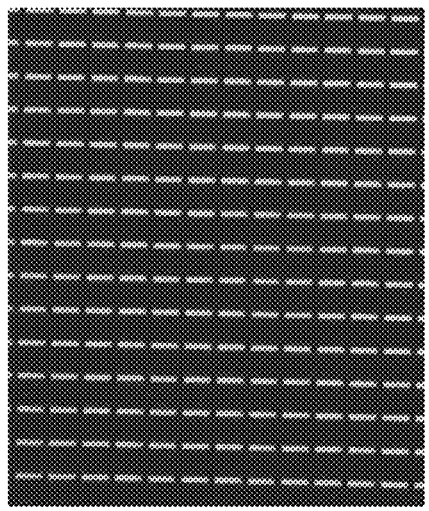

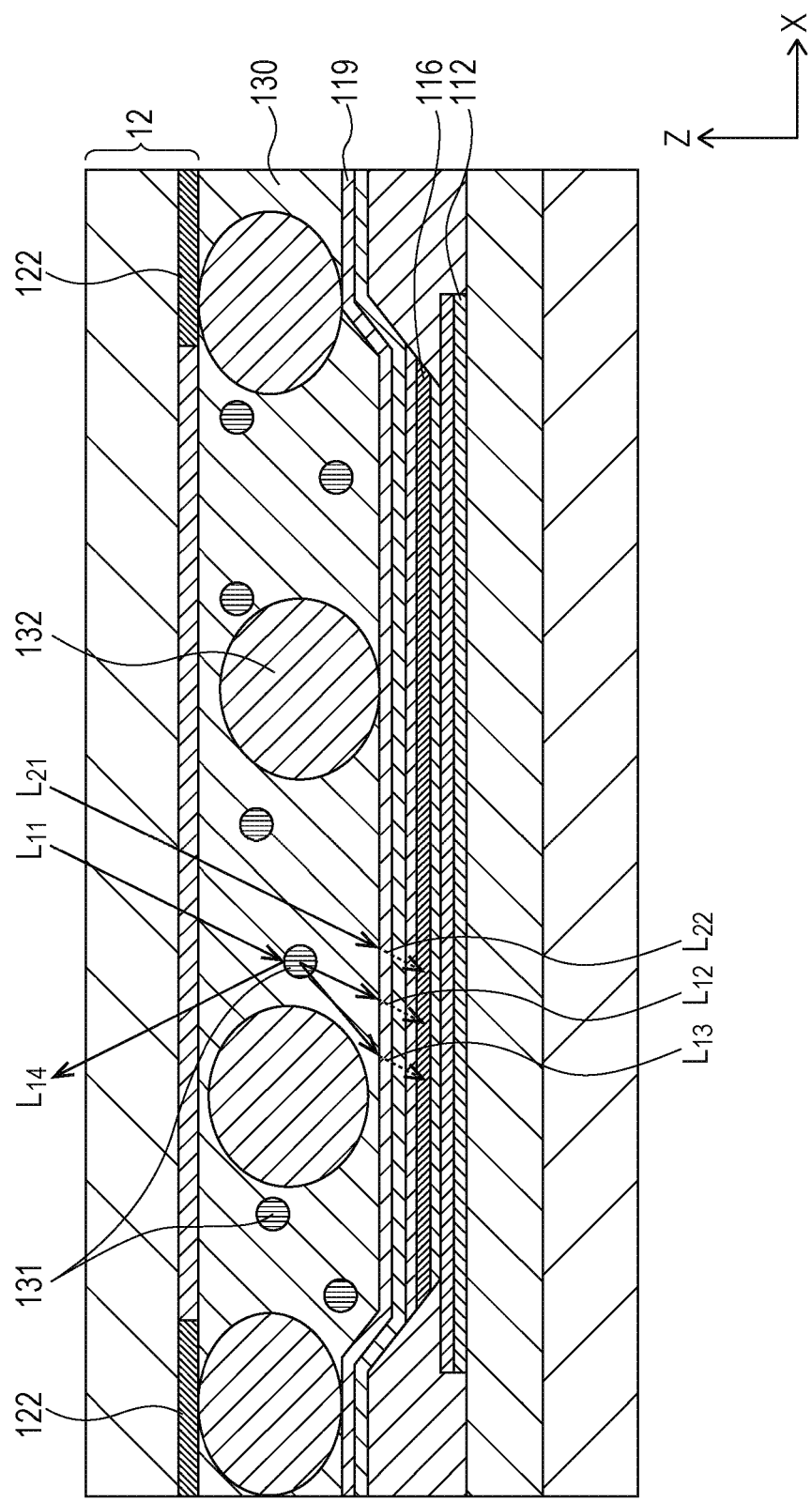

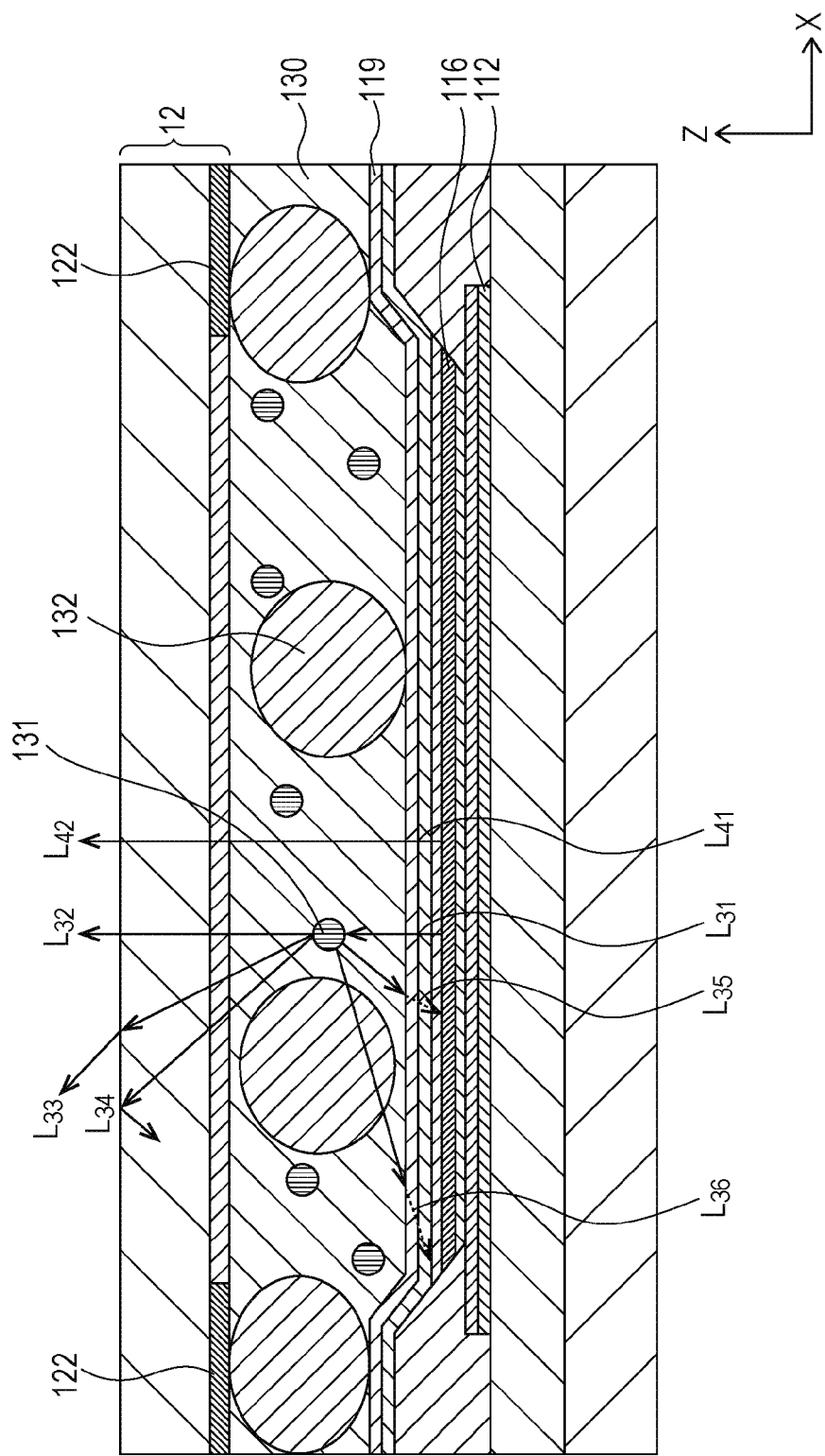

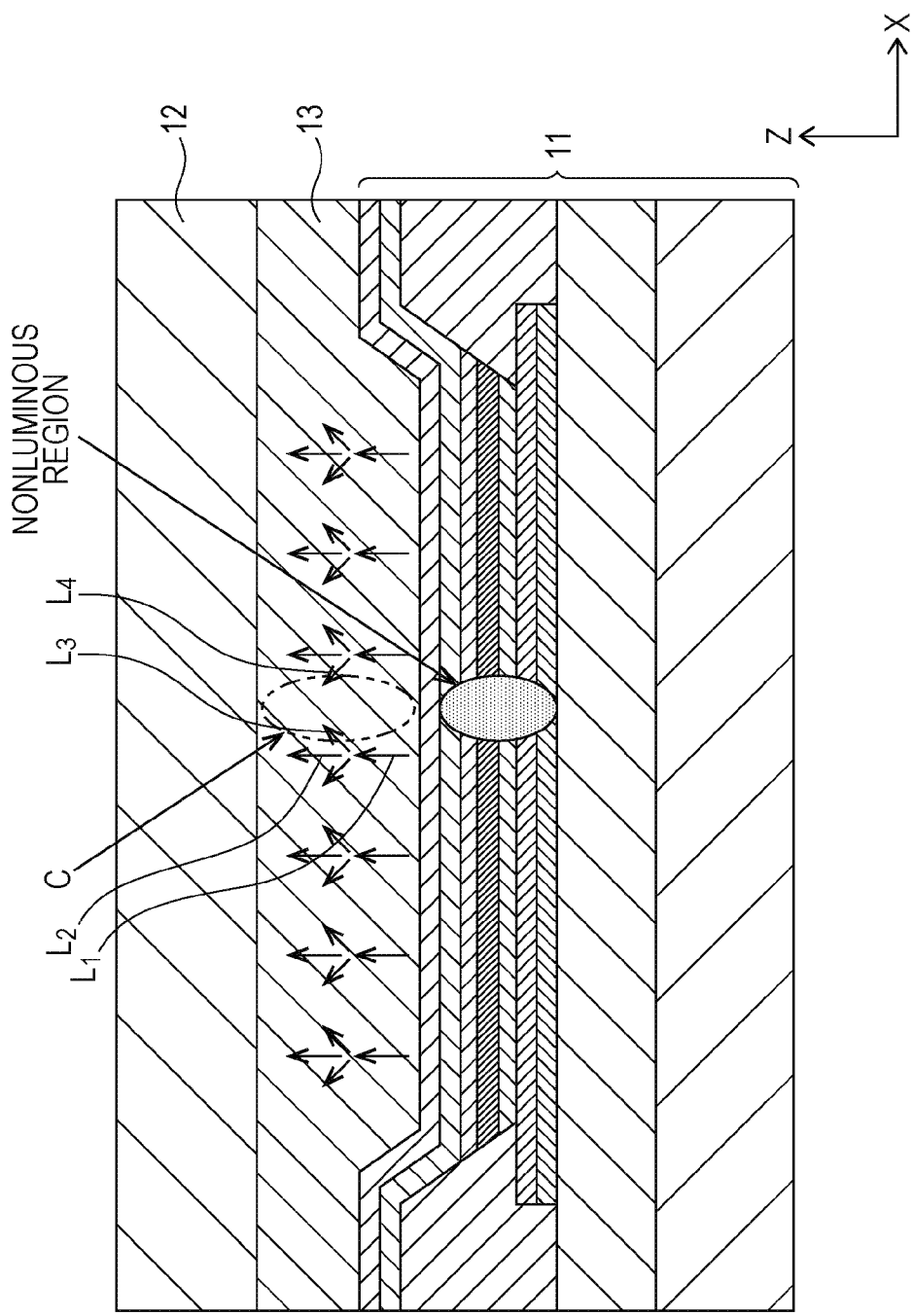

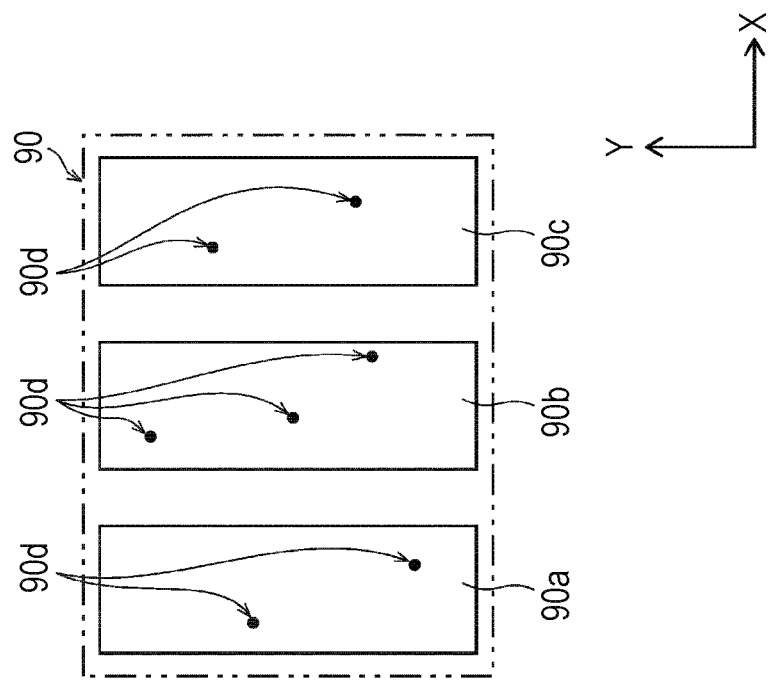
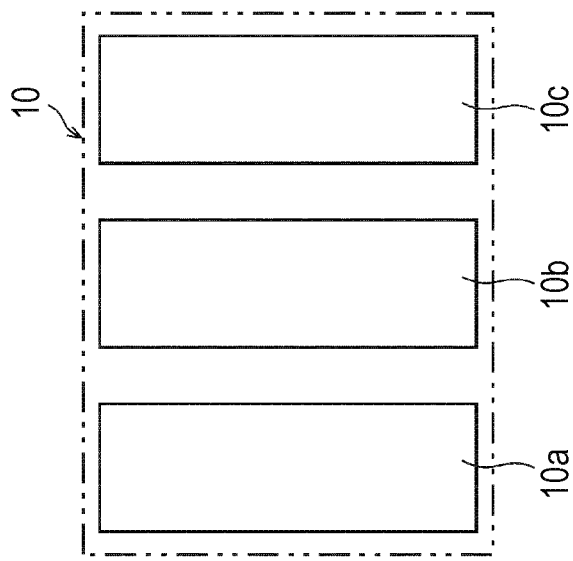

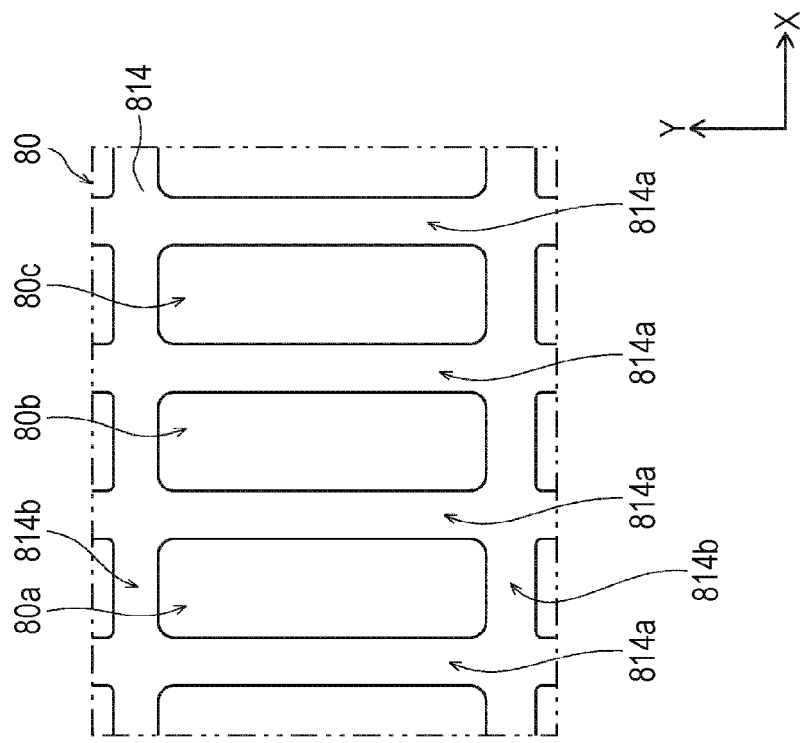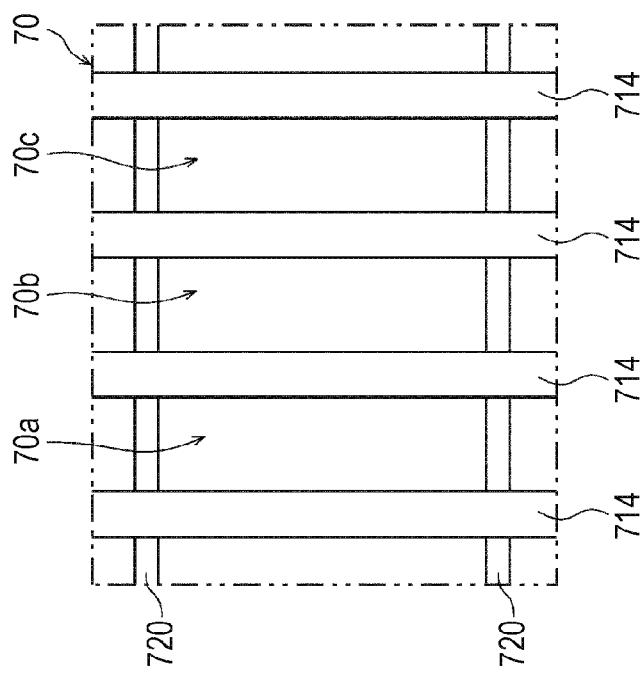

ORGANIC LIGHT-EMITTING DEVICE AND ORGANIC DISPLAY APPARATUS

BACKGROUND

1. Technical Field

The present disclosure relates to organic light-emitting devices and organic display apparatuses, and in particular to a structure of a coating layer disposed to cover a luminous part.

2. Description of the Related Art

In recent years, organic light-emitting devices, such as an organic EL (electro-luminescence) panel and organic EL lighting, have been intensively developed.

An organic EL panel includes a first panel in which an EL luminous part is formed and a second panel disposed so as to face the first panel. A resin layer inserted between the first panel and the second panel joins the first panel and the second panel. A panel periphery in a gap between the first panel and the second panel is also sealed. The first panel has a structure including a TFT substrate, a lamination of an electrode, an organic functional layer (including an organic luminous layer), and an electrode formed in this order on one main surface of the TFT substrate, and a sealing layer coating these layers.

The resin layer is inserted between the first panel and the second panel so as to closely contact the first panel and the second panel. The resin joins the first panel and the second panel.

Organic layers included in a structure of organic light-emitting devices, such as an organic EL panel, are susceptible to entry of substances such as water and oxygen from outside, and to outgas (various kinds of gas including water and oxygen) emitted from components after panel completion. This may produce a nonluminous region such as a dark spot, and cause decline in light emission efficiency.

Patent Literature 1 discloses a technique for dispersing, in the resin layer, particles (getter particles) that have hygroscopicity, thereby capturing substances such as water and oxygen, and protecting the organic layers.

CITATION LIST

Patent Literature

PTL 1: Unexamined Japanese Patent Publication No. 2006-228519

However, when the structure disclosed in Patent Literature 1 is to be employed, particles exists in a path for light emitted from the organic luminous layer, and thus it is necessary to secure transparency to light. Lower transparency to light leads to decline in light extraction efficiency, which inhibits securing performance as a light-emitting device. In addition, incident external light is scattered by the particles and generates a cloudy phenomenon (haze), and lowered contrast may cause degradation in display quality.

SUMMARY

One non-limiting and exemplary embodiment provides an organic light-emitting device and an organic display apparatus capable of achieving high light-emission quality and high light-extraction efficiency, in a device structure where emitted light passes through a coating layer and is extracted outward, by inhibiting occurrence of a cloudy phenomenon even when external light enters, while inhibiting functional degradation of an organic layer under influence of substances such as water and oxygen that enter from outside, and outgas.

In one general aspect, the techniques disclosed here feature an organic light-emitting device including: a first panel; a second panel disposed to face the first panel with a gap between the first panel and the second panel; and a coating layer inserted between the first panel and the second panel so as to contact the first panel and the second panel. The first panel includes a first substrate and a luminous part formed on one main surface of the first substrate, the luminous part including an organic layer in structure and emitting light opposite to the first substrate.

The coating layer transmits the light from the luminous part. A plurality of particles are dispersed in at least some region of the coating layer. Each of the plurality of particles is formed of a material selected from the group consisting of synthetic zeolite, aluminum oxide, calcium oxide, calcium chloride, active anhydrous calcium sulfate, magnesium oxide, magnesium perchlorate, magnesium sulfate, phosphorus oxide, potassium carbonate, potassium hydroxide, silica gel, sodium hydroxide, sodium sulfate, and zinc chloride.

In the organic light-emitting device according to the present aspect, when a particle size parameter (size parameter; $\pi D/(\lambda/n)$) is plotted on a horizontal axis and scattering efficiency Qc (=scattering sectional area/geometrical sectional area) is plotted on a vertical axis, an average particle size D50 of the plurality of particles is set in a range equal to or greater than a value of the particle size parameter at which the scattering efficiency becomes maximum.

In the organic light-emitting device according to the above aspect, the average particle size D50 of the plurality of particles is set in the above range. In other words, in the organic light-emitting device according to the present aspect, dispersing in resin the plurality of particles with the average particle size D50 in the above range can cause Mie-scattering.

Therefore, the organic light-emitting device according to the above aspect is capable of achieving high light-emission quality and high light-extraction efficiency, by inhibiting occurrence of a cloudy phenomenon even when external light enters, while inhibiting functional degradation of an organic layer under influence of substances such as water and oxygen that enter from outside, and outgas.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

It should be noted that general or specific embodiments may be implemented as a system, a method, an integrated circuit, a computer program, a storage medium, or any selective combination thereof.

BRIEF DESCRIPTION OF THE DRAWINGS

FIG. 1 is a graph illustrating scattering efficiency Qc of getter particles;

FIG. 5 is a schematic sectional view illustrating a structure taken along line A-A of FIG. 4;

FIG. 12A is an image illustrating a state of EL light emission in red;

FIG. 12B is an image illustrating a state of EL light emission in green;

FIG. 12C is an image illustrating a state of EL light emission in blue;

FIG. 12D is an image illustrating a state of EL light emission in white;

FIG. 13A is a schematic sectional view illustrating a state of external light scattering;

FIG. 13B is a schematic sectional view illustrating a state of EL light emission;

FIG. 18 is a schematic diagram illustrating how light is scattered in resin layer 13 including getter particles 131;

FIG. 19A is a schematic diagram illustrating a light emission state of subpixels 10a to 10c in display panel 10;

FIG. 19B is a schematic diagram illustrating a light emission state of subpixels 90a to 90c in display panel 90 according to a comparative example;

FIG. 22A is a schematic plan view illustrating arrangement of first banks 714 and second banks 720 in display panel 70 according to First variation; and FIG. 22B is a schematic plan view illustrating arrangement of bank 814 in display panel 80 according to Second variation.

DETAILED DESCRIPTION OF THE EMBODIMENTS

Figure 2A:
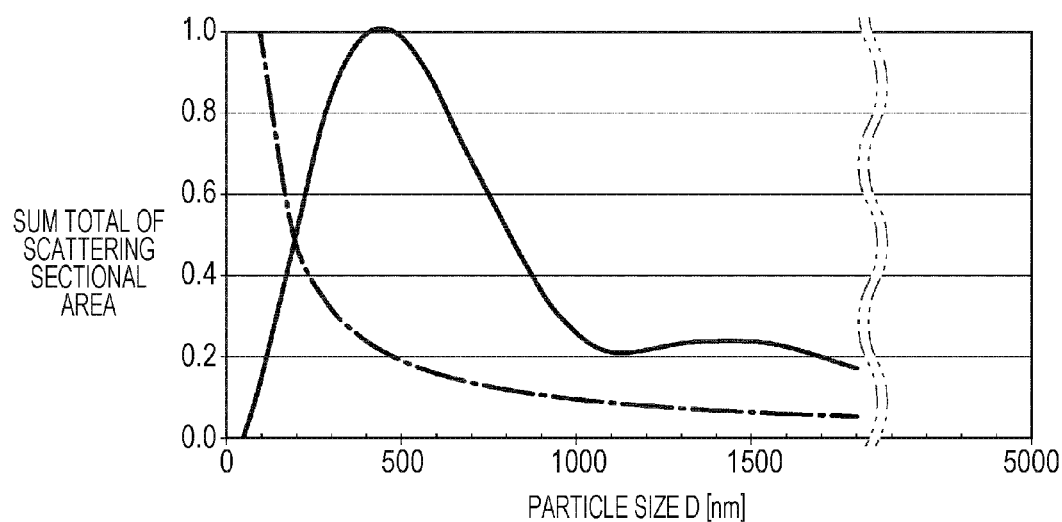
FIG. 2A is a graph illustrating a relationship between a sum total of scattering sectional area per unit volume and a particle size.

[Underlying Knowledge Forming Basis of Each Aspect of the Present Disclosure]

The present inventor has made the following studies in a process of perceiving each aspect of the present disclosure.

First, as in a technique disclosed in the above-described Patent Literature 1, dispersing getter particles in a resin layer (coating layer) inserted between panels is effective in protecting an organic layer from substances such as water that enters from outside.

However, in a case of dispersing the getter particles as described above in the resin layer that serves as a path for light from an organic luminous layer, it is necessary to control light scattering in addition to hygroscopicity by the getter particles to minimize inhibition of light transmission.

The present inventor has studied a relationship between a particle size of the getter particles, and transmittance and hygroscopicity, and has concluded it is preferable that the getter particle have larger particle size. When the particle size of the getter particles is equivalent to or not less than a visible light wavelength, light of the visible light wavelength is Mie-scattered by the getter particles. A probability of the light of the visible light wavelength being scattered by the getter particles is proportional to a scattering sectional area, except for a case where a particle concentration is high and multiple scattering occurs. Therefore, the scattering probability is determined by the scattering sectional area per one particle and a number of particles. When the concentration of the getter particles per unit volume is identical, the number of particles decreases as the particle size of the getter particles is larger. Accordingly, a product of the scattering sectional area per one particle and the number of particles becomes smaller, and the scattering probability can be reduced.

FIG. 1 is a graph illustrating a simulation result of scattering efficiency Qc (=scattering sectional area/geometrical sectional area) per one getter particle. It is known from Mie theory that the scattering efficiency Qc is dependent on a ratio of a visible light wavelength $\lambda$ to a particle size D ($\pi D/(\lambda/n_{(130)})$), a size parameter (particle size parameter; $\pi D/(\lambda/n)$), and a ratio ($m=m_r+im_i$) of a refractive index $n_{(131)}$ of the getter particle to a refractive index $n_{(130)}$ of the resin part. In FIG. 1, the refractive index $n_{(130)}=1.52$ and the wavelength $\lambda=450$ nm of the resin part are used as an example.

The refractive index $n_{(130)}$ of the resin part used as a sealing resin is typically "1.3 to 1.6" in many cases. In contrast, the refractive index $n_{(131)}$ of the getter particle that has a function as a getter material is typically "1.4 to 2.0" in many cases. Therefore, a combination of "1.0 to 1.5" is a typical value of m. Here, an absorption component $m_i$ is "0".

As illustrated in FIG. 1, in a size equivalent to or not less than the size of the particle with which Mie-scattering occurs, the scattering efficiency Qc shows magnitude of approximately "1 to 5", and approaches approximately "2" gradually as the particle size D increases. In a case where the absorption component $m_i$ is not "0", the scattering efficiency Qc becomes smaller on the whole, and approaches magnitude of approximately "1 to 2" gradually as the particle size D increases.

Figure 2B:
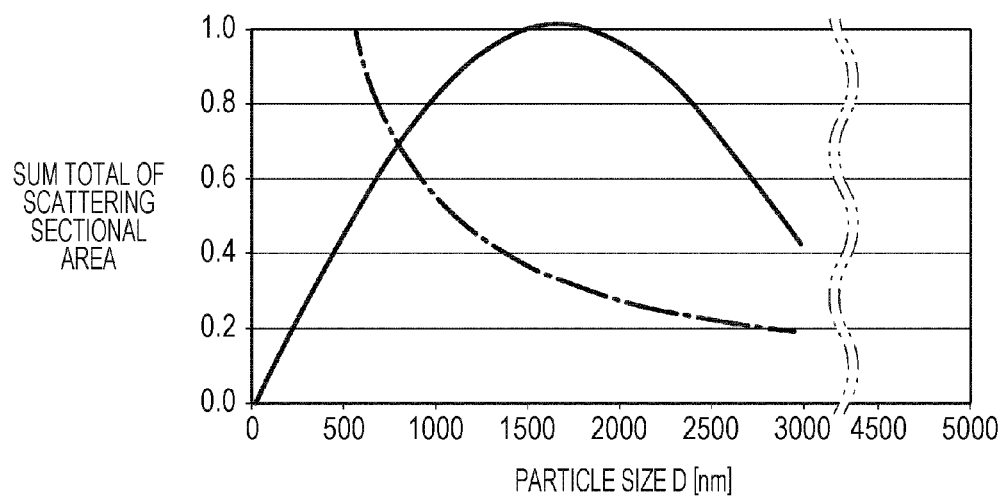
FIG. 2B is a graph illustrating a relationship between a sum total of scattering sectional area per unit volume and a particle size.

Next, solid lines of FIG. 2A and FIG. 2B are each a graph illustrating a sum total of the scattering sectional area per unit volume when the particle size D is changed. It is assumed here that volume density of the getter particle is constant. The sum total of the scattering sectional area is a product of the scattering sectional area per one getter particle and the number of particles per unit volume. The sum total of the scattering sectional area is proportional to a loss by light scattering per unit volume. Since the scattering efficiency Qc is dependent on the refractive-index ratio m as illustrated in FIG. 1, the sum total of the scattering sectional area is also dependent on the refractive-index ratio m. FIG. 2A illustrates a simulation result when the refractive-index ratio m of the refractive index of the getter particle to the refractive index of the resin part is "1.33". FIG. 2B illustrates a simulation result when the refractive-index ratio m is "0.97".

Next, dot-dash lines of FIG. 2A and FIG. 2B each illustrate a case of an assumption that the scattering efficiency Qc is "1" and that the scattering sectional area accords with a geometrical sectional area. When it is assumed that the volume density of the getter particles is constant, the number of particles decreases as the particle size D increases, and the sum total of the scattering sectional area is a curved line inversely related to the particle size D. In a range where the particle size D is equivalent to or not less than the wavelength, the scattering efficiency Qc is attenuated as the particle size D increases. Thus, it is understood that the sum total of the scattering sectional area per unit volume decreases as the particle size D increases. That is, it is understood that the loss caused by light scattering decreases as the particle size D increases.

FIG. 2A illustrates a range of the particle size D of up to approximately 2000 nm, and FIG. 2B illustrates a range of the particle size D of up to approximately 3000 nm. However, it is considered that the sum total of the scattering sectional area tends to converge when the particle size D is at least approximately 5000 nm.

Even when the particle size D is equivalent to or not larger than the wavelength, the scattering sectional area decreases, and in particular, in a range where the particle size D is 100 nm or less, the scattering sectional area becomes so small as to be negligible. This range is called a Rayleigh scattering range. For such extra-fine particles, the scattering efficiency Qc increases inversely with the wavelength λ to the power of four, and wavelength dependence becomes stronger. Accordingly, when such extra-fine particles are employed in a display device such as an organic EL device, blue color having a short wavelength is scattered more, which causes a color imbalance in blue (B), green (G), and red (R). Accordingly, it is inappropriate to use such extra-fine particles in the display device.

As described above, each aspect of the present disclosure is based on that the scattering probability of light decreases as the particle size D increases, in a range where Mie-scattering occurs with the particle size of the getter particles equal to or larger than a half wavelength of the visible light wavelength.

Next, in an attempt to employ the getter particles having a large particle size, it is considered that the getter particles may inflict damage on an organic functional layer during lamination of a first panel and a second panel. The damage inflicted on the organic functional layer prevents securing light emission performance, and may cause a short circuit in some cases.

From a result of the aforementioned studies, each of the following aspects will be provided.

[Aspects of the Present Disclosure]

In one general aspect, the techniques disclosed here feature an organic light-emitting device including: a first panel; a second panel disposed to face the first panel with a gap between the first panel and the second panel; and a coating layer inserted between the first panel and the second panel so as to contact the first panel and the second panel. The first panel includes a first substrate and a luminous part formed on one main surface of the first substrate, the luminous part including an organic layer in structure and emitting light opposite to the first substrate.

The coating layer transmits the light from the luminous part, and a plurality of particles are dispersed in at least some region of the coating layer. Each of the plurality of particles is formed of a material selected from the group consisting of synthetic zeolite, aluminum oxide, calcium oxide, calcium chloride, active anhydrous calcium sulfate, magnesium oxide, magnesium perchlorate, magnesium sulfate, phosphorus oxide, potassium carbonate, potassium hydroxide, silica gel, sodium hydroxide, sodium sulfate, and zinc chloride.

In the organic light-emitting device according to the present aspect, when a particle size parameter (size parameter; $\pi D/(\lambda/n)$) is plotted on a horizontal axis and scattering efficiency Qc (=scattering sectional area/geometrical sectional area) is plotted on a vertical axis, an average particle size D50 of the plurality of particles is set in a range equal to or greater than a value of the particle size parameter at which the scattering efficiency becomes maximum.

In the organic light-emitting device according to this aspect, the average particle size D50 of the plurality of particles is set in the above range. In other words, in the organic light-emitting device according to the present aspect, dispersing in resin the plurality of particles with the average particle size D50 in the above range can cause Mie-scattering.

Therefore, the organic light-emitting device according to the present aspect is capable of achieving high light-emission quality and high light-extraction efficiency by inhibiting occurrence of a cloudy phenomenon even when external light enters, while inhibiting functional degradation of the organic functional layer under influence of substances such as water and oxygen entering from outside, and outgas.

In the organic light-emitting device according to another aspect, in the above aspect, the average particle size D50 of the plurality of particles satisfies a relationship of 0.4 µm≤D50≤10 µm. Defining the average particle size D50 to satisfy such a relationship allows inhibition of scattering of light (scattering of light emitted from the organic luminous layer) resulting from dispersion of the plurality of particles in the coating layer while maintaining adsorption performances of water or the like.

In the organic light-emitting device according to another aspect, in the above aspect, the average particle size D50 of the plurality of particles satisfies a relationship of 3

µm≤D50≤10 µm. Defining the average particle size D50 to satisfy such a relationship is more preferable for obtaining effects of inhibiting scattering of light (scattering of light emitted from the organic luminous layer) resulting from dispersion of the plurality of particles in the coating layer while maintaining adsorption performances of water or the like.

In the organic light-emitting device according to another aspect, in the above aspect, the plurality of particles are included in the at least some region of the coating layer in quantity corresponding to a total surface area per 1 $cm^2$ equal to or less than 0.2 $cm^2$. Defining an amount of the plurality of particles to be added to the coating layer in this way inhibits external light scattering and the cloudy phenomenon (haze).

In the organic light-emitting device according to another aspect, in the above aspect, the coating layer includes the plurality of particles dispersed in a resin part made of a resin material, and the average particle size D50 of the plurality of particles is 2 m or larger. Defining the refractive-index ratio of the particles to the resin part and the average particle size D50 of the plurality of particles in this way makes it possible to achieve high light-emission quality and high light-extraction efficiency by inhibiting occurrence of the cloudy phenomenon even when external light enters, while inhibiting functional degradation of the organic functional layer under influence of substances such as water and oxygen entering from outside, and outgas. In this case, as illustrated in FIG. 1, FIG. 2A, FIG. 2B, and other diagrams, it is preferable that the refractive-index ratio of the particles to the resin part be 0.97 or more.

In the organic light-emitting device according to another aspect, in the above aspect, the coating layer includes the plurality of particles dispersed in the resin part made of the resin material, the refractive-index ratio of the particles to the resin part is 1.3 or more, and the average particle size D50 of the plurality of particles is 0.5 µm or larger. Defining the refractive-index ratio of the particles to the resin part and the average particle size D50 of the plurality of particles in this way also makes it possible to achieve high light-emission quality and high light-extraction efficiency by inhibiting occurrence of the cloudy phenomenon even when external light enters, while inhibiting functional degradation of the organic functional layer under influence of substances such as water and oxygen entering from outside, and outgas.

Furthermore, in the organic light-emitting device according to another aspect, in the above aspect, when the plurality of particles constitute a first particle group, a plurality of particles that constitute a second particle group are also dispersed in at least some region of the coating layer (this region does not necessarily need to accord with the region where the plurality of particles that constitute the first particle group are dispersed). The plurality of particles that constitute the second particle group are different from those that constitute the first particle group.

The particles that constitute the second particle group include any of polyethylene, polypropylene, polymethylpentene, polyvinyl chloride, polytetrafluoroethylene, polystyrene, polymethyl methacrylate, polyethylene terephthalate, polybutylene terephthalate, polyamide, polyimide, polysulfone, polyphenylene oxide, polyacetal, an epoxy resin, a phenol resin, a melamine resin, and an unsaturated polyester resin, or any resin that has a bridged structure and is selected from the group consisting of divinylbenzene polymer, divinylbenzene-styrene copolymer, divinylbenzene-acrylic ester copolymer, diallyl phthalate polymer, and triallyl isocyanurate polymer.

When an average particle size of the plurality of particles that constitute the first particle group is defined as $D50_{(1)}$ and an average particle size of the plurality of particles that constitute the second particle group is defined as $D50_{(2)}$, a relationship of $D50_{(2)} > D50_{(1)}$ is satisfied.

Here, it is also considered that the particles that constitute the first particle group dispersed in the coating layer disposed between the first panel and the second panel inflict damage to the organic functional layer during panel lamination in a manufacturing process. Specifically, a situation can be considered in which, during lamination of the first panel and the second panel, the plurality of particles that constitute the first particle group dispersed in the resin material break through part of layers that constitute the organic functional layer. If the particles break through part of layers of the organic functional layer in this way, a short circuit is produced and this region and a surrounding region is a nonluminous region. In particular, when the particle size of the particles that constitute the first particle group is increased in consideration of factors such as scattering of light and moisture absorption performance, such a problem is more likely to occur.

For such assumed problems, in the organic light-emitting device according to the present aspect, the plurality of particles that constitute the second particle group is dispersed in the coating layer. The plurality of particles that constitute the second particle group has the average particle size $D50_{(2)}$ larger than the average particle size $D50_{(1)}$ of the plurality of particles that constitute the first particle group as described above, and materials thereof are formed of the above resin materials with low hardness.

As described above, in the organic light-emitting device according to the present aspect, during lamination of the first panel and the second panel, part of the plurality of particles that constitute the second particle group contact the organic functional layer, before part of the plurality of particles that constitute the first particle group contact the organic functional layer. Therefore, in comprehensive consideration of the above relationship of hardness, in the organic light-emitting device according to the present aspect, dispersing the plurality of particles that constitute the first particle group in the coating layer can provide the above effects, and can inhibit damage to the organic functional layer by the plurality of particles that constitute the first particle group during panel lamination.

Therefore, the organic light-emitting device according to the present aspect can also inhibit damage to the organic layer (organic functional layer) by the plurality of particles that constitute the first particle group in the manufacturing process.

In the organic light-emitting device according to another aspect, in the above aspect, a difference in a refractive index between each of the particles that constitute the second particle group and the resin part is smaller than a difference in a refractive index between each of the particles that constitute the first particle group and the resin part. This inhibits light emitted from the organic luminous layer from being scattered by each of the plurality of particles that constitute the second particle group, which is preferable in obtaining high light-emission performance.

The organic light-emitting device according to another aspect satisfies a relationship of 1 µm≤$D50_{(2)}$≤100 µm in the above aspect. Defining the average particle size $D50_{(2)}$ of the plurality of particles that constitute the second particle group in this way allows more secure inhibition of damage to the organic functional layer by the plurality of particles that constitute the first particle group during panel lamination.

It is more preferable that a relationship of 5 μm≤ $D50_{(2)}$≤30 μm be satisfied.

In addition, when a Cv value of the second particle group is defined as $Cv_{(2)}$, the organic light-emitting device according to another aspect satisfies a relationship of $Cv_{(2)}$≤3% in the above aspect. Defining the Cv value of the second particle group in this way allows inhibition of local load being applied to part of the plurality of particles that constitute the second particle group during panel lamination.

Note that the Cv value is a value obtained by dividing standard deviation by the average particle size.

In the organic light-emitting device according to another aspect, in the above aspect, each of the particles that constitute the second particle group has 10% compressive modulus of elasticity within a range from not less than 2 GPa to not more than 6 GPa. Employing the particles with such hardness as the particles that constitute the second particle group allows more secure inhibition of damage to the organic functional layer during panel lamination.

In addition, in the organic light-emitting device according to another aspect, in the above aspect, transmittance of the light from the luminous part in the coating layer is 98% or more. This is preferable for securing luminous performance excellent as a light-emitting device. In addition, this allows inhibition of the cloudy phenomenon (haze) caused by external light scattering, which is preferable for securing display quality also when the organic light-emitting device is used as a display device.

An organic display apparatus according to one aspect of the present disclosure includes a display panel and a control-drive circuit. The control-drive circuit is a circuit connected to the display panel. A device structure of either of the above aspects is employed as the display panel. This makes it possible to achieve effects achieved by the organic light-emitting device of the above aspects.

Exemplary Embodiment

A configuration of organic EL display apparatus 1 according to an exemplary embodiment will be described below with reference to the drawings.

1. Schematic Configuration

The schematic configuration of organic EL display apparatus 1 according to the present exemplary embodiment will be described with reference to FIG. 3 and FIG. 4.

Figure 3:
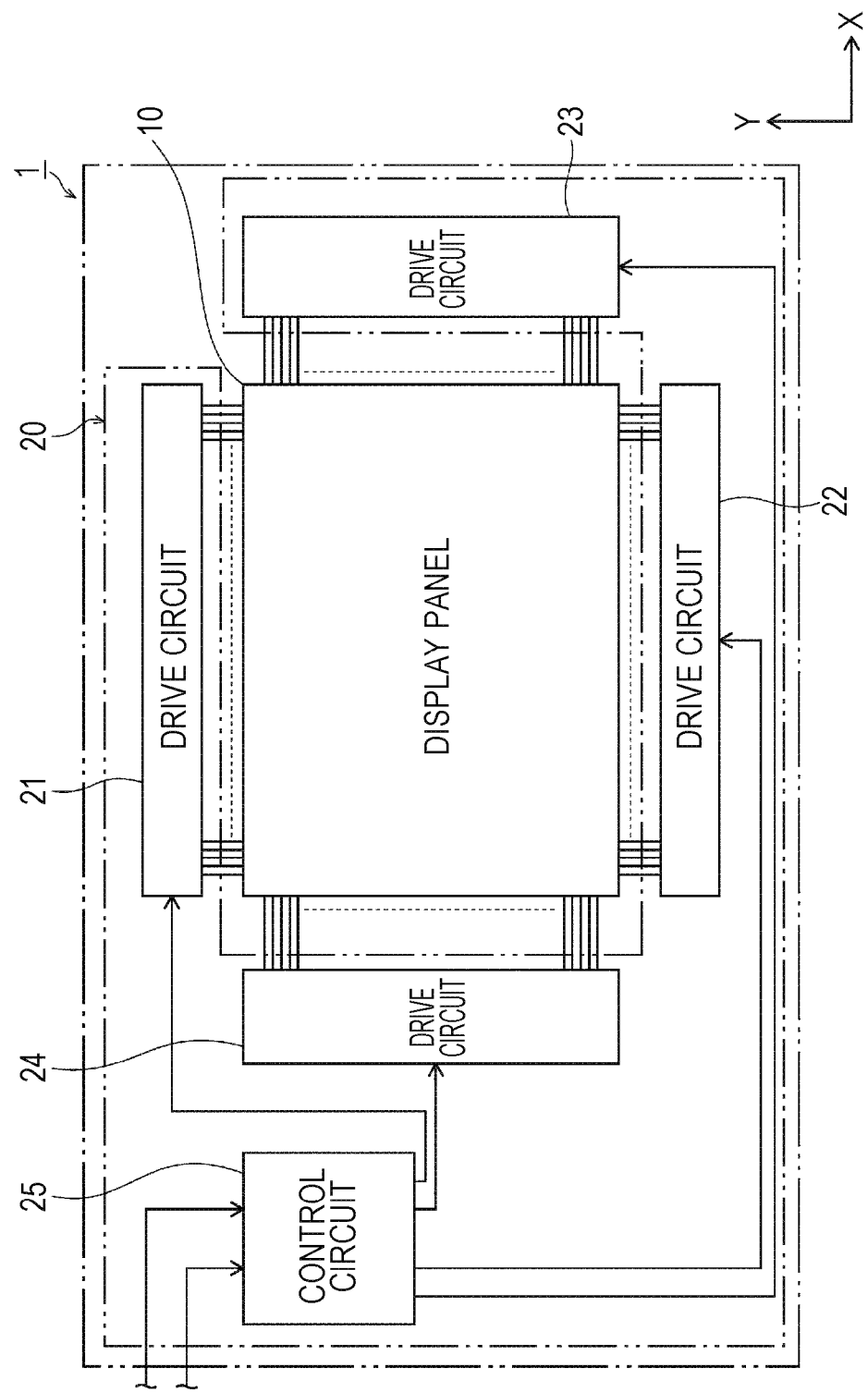
FIG. 3 is a schematic block diagram illustrating a schematic configuration of organic EL display apparatus 1 according to an exemplary embodiment of the present disclosure.

As illustrated in FIG. 3, organic EL display apparatus 1 according to the present exemplary embodiment as an organic display apparatus includes display panel 10 and driver-controller 20 connected to display panel 10. Display panel 10 is an organic light-emitting device, and is an organic EL panel using electroluminescence of an organic material.

Figure 4:
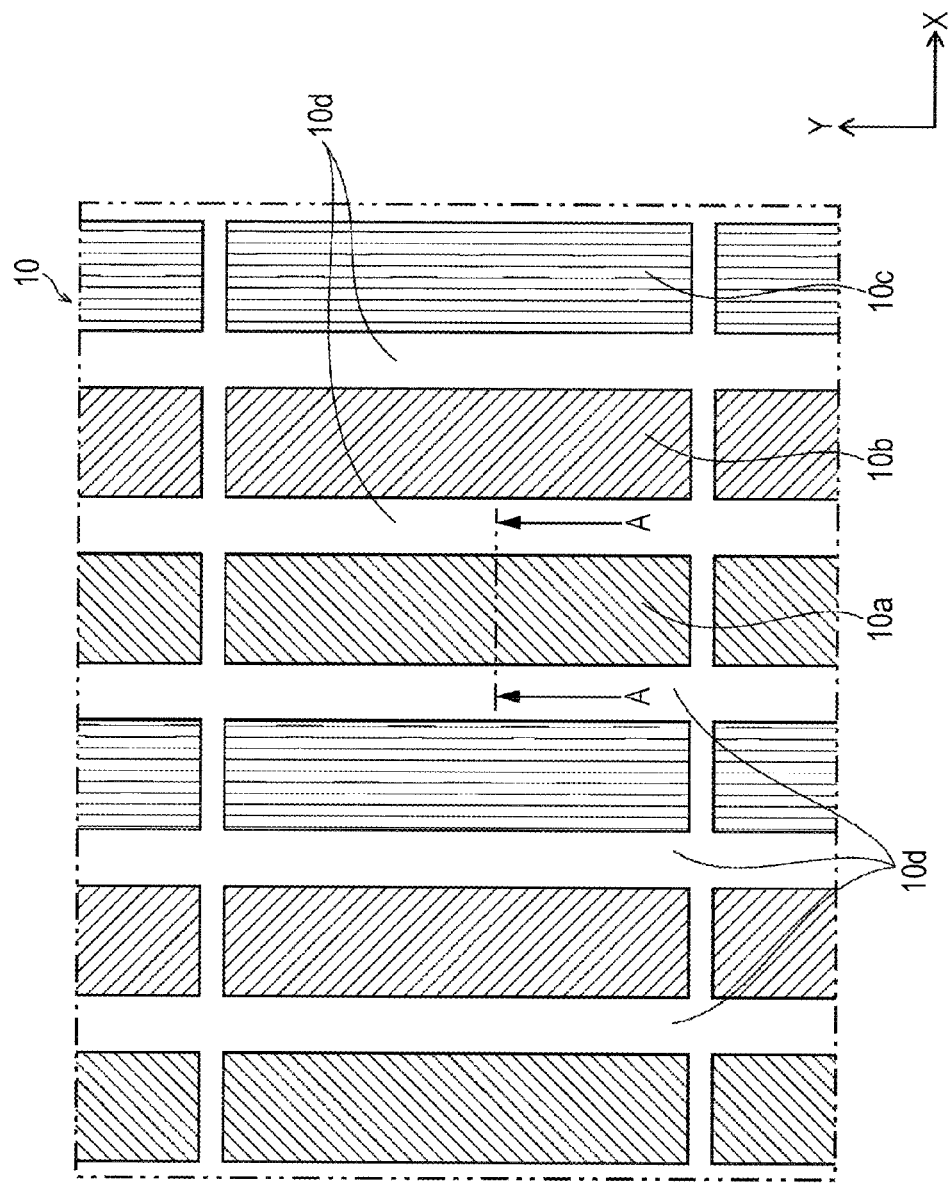
FIG. 4 is a schematic plan view illustrating an arrangement form of subpixels 10a to 10c in display panel 10.

As illustrated in FIG. 4, a plurality of subpixels 10a to 10c are two-dimensionally arranged in an X-axis direction and a Y-axis direction. In the present exemplary embodiment, for example, subpixel 10a is a luminous part that emits red light (R), subpixel 10b is a luminous part that emits green light (G), and subpixel 10c is a luminous part that emits blue light (B). A combination of three adjacent subpixels 10a to 10c forms one pixel (picture element part).

Nonluminous part 10d is provided between adjacent subpixels 10a to 10c.

Returning to FIG. 3, driver-controller 20 in organic EL display apparatus 1 includes four drive circuits 21 to 24 and control circuit 25. A positional relationship between display panel 10 and driver-controller 20 in organic EL display apparatus 1 is not limited to a form of FIG. 3.

The configuration of pixels may not be limited to the form of the combination of three subpixels 10a to 10c as illustrated in FIG. 4. The combination of four or more subpixels may form one pixel.

2. Structure of Display Panel 10

As illustrated in FIG. 5, in display panel 10, EL panel part 11 and CF panel part 12 are disposed face-to-face and are joined to each other by resin layer 13 disposed between EL panel part 11 and CF panel part 12.

EL panel part 11 has, as a base, TFT substrate 110, on which insulating layer 111 is laminated. A Z-axis upper surface of insulating layer 111 is formed to be generally flat.

A simplified diagram of TFT substrate 110 is used with illustration of layers such as a TFT layer omitted.

Anode 112 and hole injection layer 113 are sequentially laminated on the Z-axis upper surface of insulating layer 111.

Next, bank 114 is formed to cover both edges of insulating layer 111 and both edges of hole injection layer 113 in the X-axis direction. Bank 114 defines an opening of a luminous region in subpixel 10a.

In the opening defined by bank 114, hole transport layer 115, organic luminous layer 116, and electron transport layer 117 are laminated in this order from a bottom in the Z-axis direction.

Cathode 118 and sealing layer 119 are sequentially formed so as to cover top surfaces of electron transport layer 117 and bank 114.

CF panel part 12 has a structure in which color filter layer 121 and black matrix layer 122 are formed on a Z-axis lower surface of substrate 120.

A Z-axis lower surface of resin layer 13 closely contacts sealing layer 119 of EL panel part 11, and a Z-axis upper surface of resin layer 13 closely contacts CF panel part 12. Resin layer 13 includes two types of particles, specifically getter particles 131 and spacer particles 132 dispersed in resin part 130.

Figure 6A:
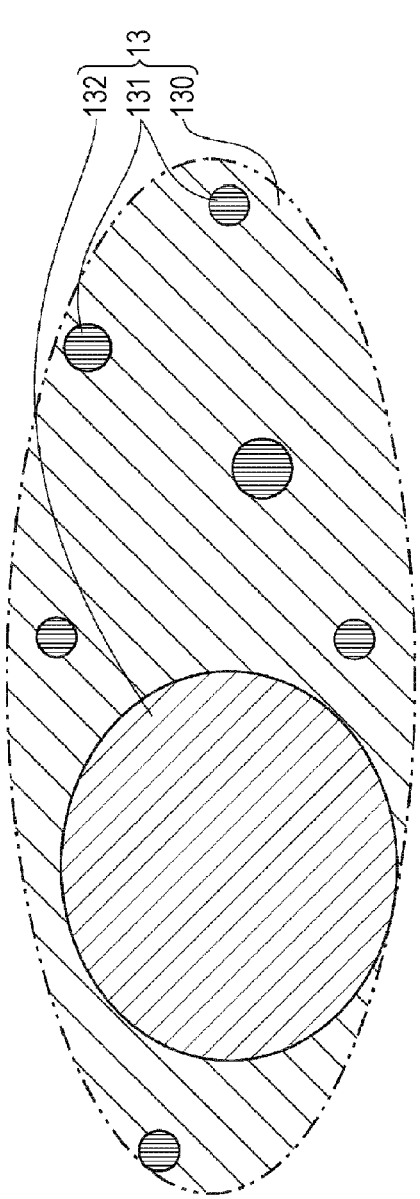
FIG. 6A is a schematic sectional view illustrating a structure of resin layer 13 in a light transparent region of display panel 10.
Figure 6B:
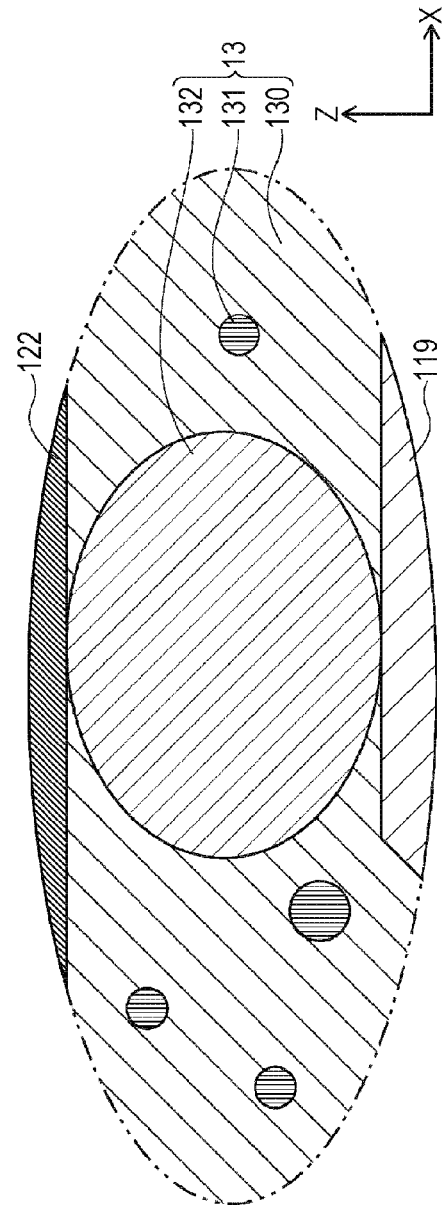
FIG. 6B is a schematic sectional view illustrating a structure of resin layer 13 in a light nontransparent region.

As illustrated in FIG. 6A and FIG. 6B, in subpixels 10a and 10b that are luminous regions, both getter particles 131 and spacer particles 132 are dispersed in resin part 130. As illustrated in FIG. 6B, in nonluminous part 10d (refer to FIG. 4 and FIG. 5), spacer particles 132 are sandwiched between a surface of sealing layer 119 in EL panel part 11 and a surface of black matrix layer 122 in CF panel part 12. In this state, nothing is achieved through manipulation of positions of spacer particles 132, but particles 132 are inserted in a probabilistic manner in relationship with an amount to be added.

Returning to FIG. 5, display panel 10 according to the present exemplary embodiment is a top-emission display panel, and emits light upward in the Z-axis direction as an arrow.

While only the structure of subpixel 10a is extracted and illustrated in FIG. 5, subpixels 10b and 10c have a similar structure.

3. Each Component of Display Panel 10

(1) TFT Substrate 110

TFT substrate 110 includes a substrate and a TFT layer formed on a Z-axis upper surface of the substrate. The TFT layer, which is not illustrated, includes layers such as three electrodes of a gate, a source, and a drain, a semiconductor layer, and a passivation film.

The substrate that serves as a base of TFT substrate 110 is formed, for example, from substrates such as a glass substrate, a quartz substrate, a silicon substrate, a metal substrate such as molybdenum sulfide, copper, zinc, aluminum, stainless steel, magnesium, iron, nickel, gold, and silver, a semiconductor substrate such as a gallium arsenide group, and a plastic substrate.

As the plastic substrate, one of a thermoplastic resin and a thermosetting resin may be used. Examples of the resin include polyolefin such as polyethylene, polypropylene, ethylene-propylene copolymer, and ethylene-vinyl acetate copolymer (EVA), cyclic polyolefin, modified polyolefin, polyvinyl chloride, polyvinylidene chloride, polystyrene, polyamide, polyimide (PI), polyamide-imide, polycarbonate, poly-(4-methylpentene-1), ionomer, an acrylic resin, polymethyl methacrylate, acrylonitrile-styrene copolymer (an AS resin), butadiene-styrene copolymer, ethylene-vinyl alcohol copolymer (EVOH), polyester such as polyethylene terephthalate (PET), polybutylene terephthalate, polyethylene naphthalate (PEN), and polycyclohexylene dimethylene terephthalate (PCT), polyether, polyether ketone, polyether sulfone (PES), polyether imide, polyacetal, polyphenylene oxide, modified polyphenylene oxide, polyarylate, aromatic polyester (liquid crystal polymer), polytetrafluoroethylene, polyvinylidene fluoride, other fluororesins, various thermoplastic elastomers, such as styrene, polyolefin, polyvinyl chloride, polyurethane, fluororubber, and chlorinated polyethylene, an epoxy resin, a phenol resin, a urea resin, a melamine resin, unsaturated polyester, a silicone resin, polyurethane, or copolymers that mainly contain these resins, blends, and a polymer alloy. A laminate including one or two types of these materials can be used.

(2) Insulating Layer 111

Insulating layer 111 is formed from, for example, organic compounds such as polyimide, polyamide, and acrylic resin materials. Insulating layer 111 preferably has resistance to an organic solvent.

Insulating layer 111, which sometimes undergoes treatment including etching treatment and baking treatment in the manufacturing process, is preferably formed from materials that have high resistance to the treatments to avoid excessive deformation and deterioration.

(3) Anode 112

Anode 112 is formed of metallic materials including silver (Ag) or aluminum (Al). A surface of top-emission display panel 10 according to the present exemplary embodiment preferably has high reflectivity.

Anode 112 can employ not only the above-described monolayer structure made of metallic materials but also a lamination of metallic layers and transparent conductive layers. As a component of the transparent conductive layer, for example, materials such as indium tin oxide (ITO) and indium zinc oxide (IZO) can be used.

(4) Hole Injection Layer 113

Hole injection layer 113 is a layer made of, for example, an oxide of silver (Ag), molybdenum (Mo), chromium (Cr), vanadium (V), tungsten (W), nickel (Ni), iridium (Ir), or a conductive polymer material such as PEDOT (mixture of polythiophene and polystyrene sulfonate).

Using a metallic oxide as a component for hole injection layer 113 allows hole injection layer 113 to have a function to inject holes into organic luminous layer 116 stably or by assisting hole generation, and to have a large work function, as compared with a case where a conductive polymer material is used, such as PEDOT.

Hole injection layer 113 formed of a transition metal oxide can have a plurality of oxidization numbers, and accordingly a plurality of levels. This results in easy hole injection and reduction in a drive voltage. In particular, it is preferable to use tungstic oxide (WOx) from a viewpoint of having functions to inject holes stably and to assist generation of holes.

(5) Bank 114

Bank 114 is formed from organic materials such as a resin, and has insulating properties. Examples of organic materials used for formation of bank 114 include an acrylic resin, a polyimide resin, and a novolac phenol resin. Bank 114 can also undergo fluorine treatment to a surface thereof in order to give water-repellency to the surface.

Furthermore, the structure of bank 114 can employ not only one-layer structure illustrated in FIG. 5 but also a multilayer structure including two or more layers. In this case, the above-described materials can be combined for each layer, and inorganic materials and organic materials can be used for each layer.

(6) Hole Transport Layer 115

Hole transport layer 115 is formed from a macromolecular compound that does not include a hydrophilic group. For example, a macromolecular compound that does not include a hydrophilic group, for example, polyfluorene and its derivative or polyarylamine and its derivative can be used.

(7) Organic Luminous Layer 116

Organic luminous layer 116 has a function to generate an excited state and to emit light through injection and recombination of holes and electrons. In order to form organic luminous layer 116, it is necessary to use a luminous organic material from which a film can be formed by a wet printing method.

Specifically, it is preferable that organic luminous layer 116 be formed of, for example, fluorescent substances described in U.S. Pat. No. 5,443,922, which is incorporated herein by reference, such as an oxinoid compound, perylene compound, coumarin compound, azacoumarin compound, oxazole compound, oxadiazole compound, perinone compound, pyrrolopyrrole compound, naphthalene compound, anthracene compound, fluorene compound, fluoranthene compound, tetracene compound, pyrene compound, coronene compound, quinolone compound, azaquinolone compound, pyrazoline derivative, pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, metal complex of a Schiff base and group III metal, oxine metal complex, and rare earth complex.

(8) Electron Transport Layer 117

Electron transport layer 117 has a function to transport electrons injected from cathode 118 to organic luminous layer 116, and is formed from, for example, oxadiazole derivative (OXD), triazole derivative (TAZ), and phenanthroline derivative (BCP, Bphen).

(9) Cathode 118

Cathode 118 is formed from, for example, indium tin oxide (ITO) or indium zinc oxide (IZO). As in the present exemplary embodiment, in a case of top emission display panel 10 according to the present exemplary embodiment, cathode 118 needs to be formed of a light-transparent material. Regarding the light-transparency, light transmittance is preferably equal to or higher than 80%.

(10) Sealing Layer 119

Sealing layer 119 has a function to inhibit organic layers, such as organic luminous layer 116, from being exposed to water or air. Sealing layer 119 is formed from, for example, materials such as silicon nitride (SiN) and silicon oxynitride (SiON). A sealing resin layer made of resin materials, such as an acrylic resin and silicone resin, may be provided on a layer formed of materials such as silicon nitride (SiN) and silicon oxynitride (SiON).

In the case of top-emission display panel 10 according to the present exemplary embodiment, sealing layer 119 needs to be formed of a light-transparent material.

(11) CF Panel Part 12

Substrate in CF panel part 12 is formed in a similar manner as described above, for example, from a glass substrate, a quartz substrate, a silicon substrate, a metal substrate such as molybdenum sulfide, copper, zinc, aluminum, stainless steel, magnesium, iron, nickel, gold, and silver, a semiconductor substrate such as a gallium arsenide group, and a plastic substrate. When a plastic substrate is employed also in CF panel part 12, one of a thermoplastic resin and a thermosetting resin may be used.

Color filter layer (CF layer) 121 in CF panel part 12 is formed of known materials that selectively transmit visible light having a wavelength range of each color of red (R), green (G), and blue (B). For example, CF layer 121 is formed of an acrylic resin as a base material.

Black matrix layer (BM layer) 122 in CF panel part 12 is formed of, for example, ultraviolet-curable resin materials including black pigment excellent in light absorptive properties and light blocking properties. Examples of specific ultraviolet-curable resin materials include an acrylic resin and the like.

(12) Resin Layer 13

Resin layer 13 is formed of a transparent resin material as a base material. A detailed structure of resin layer 13 will be described below.

4. Structure of Resin Layer 13

Resin layer 13 includes, as described above, resin part 130, and the plurality of getter particles 131 and the plurality of spacer particles 132 dispersed in resin part 130. In the present exemplary embodiment, getter particles 131 and spacer particles 132 are dispersed in an entire region of resin layer 13.

Resin part 130 is formed of a transparent resin material, as described above. For example, resin part 130 is formed of an epoxy resin material. However, a material such as a silicone resin can also be used besides an epoxy resin material as a component of resin part 130.

Getter particles 131 are formed of a material selected from the group consisting of synthetic zeolite, aluminum oxide, calcium oxide, calcium chloride, active anhydrous calcium sulfate, magnesium oxide, magnesium perchlorate, magnesium sulfate, phosphorus oxide, potassium carbonate, potassium hydroxide, silica gel, sodium hydroxide, sodium sulfate, and zinc chloride. In the present exemplary embodiment, getter particles 131 are formed of synthetic zeolite (crystalline zeolite: $M_{2/n}A_2O_3 \cdot xSiO_2 \cdot yH_2O$, M; metal cation, n; valence) as an example. More specifically, 5A Molecular Sieve (a product name of Linde North America Inc.) is employed.

Spacer particles 132 include any of polyethylene, polypropylene, polymethylpentene, polyvinyl chloride, polytetrafluoroethylene, polystyrene, polymethyl methacrylate, polyethylene terephthalate, polybutylene terephthalate, polyamide, polyimide, polysulfone, polyphenylene oxide, polyacetal, an epoxy resin, a phenol resin, a melamine resin, and an unsaturated polyester resin, or any resin that has a bridged structure and is selected from the group consisting of divinylbenzene polymer, divinylbenzene-styrene copolymer, divinylbenzene-acrylic ester copolymer, diallyl phthalate polymer, and triallyl isocyanurate polymer. In the present exemplary embodiment, spacer particles 132 are formed of an epoxy resin material as an example.

Figure 7:
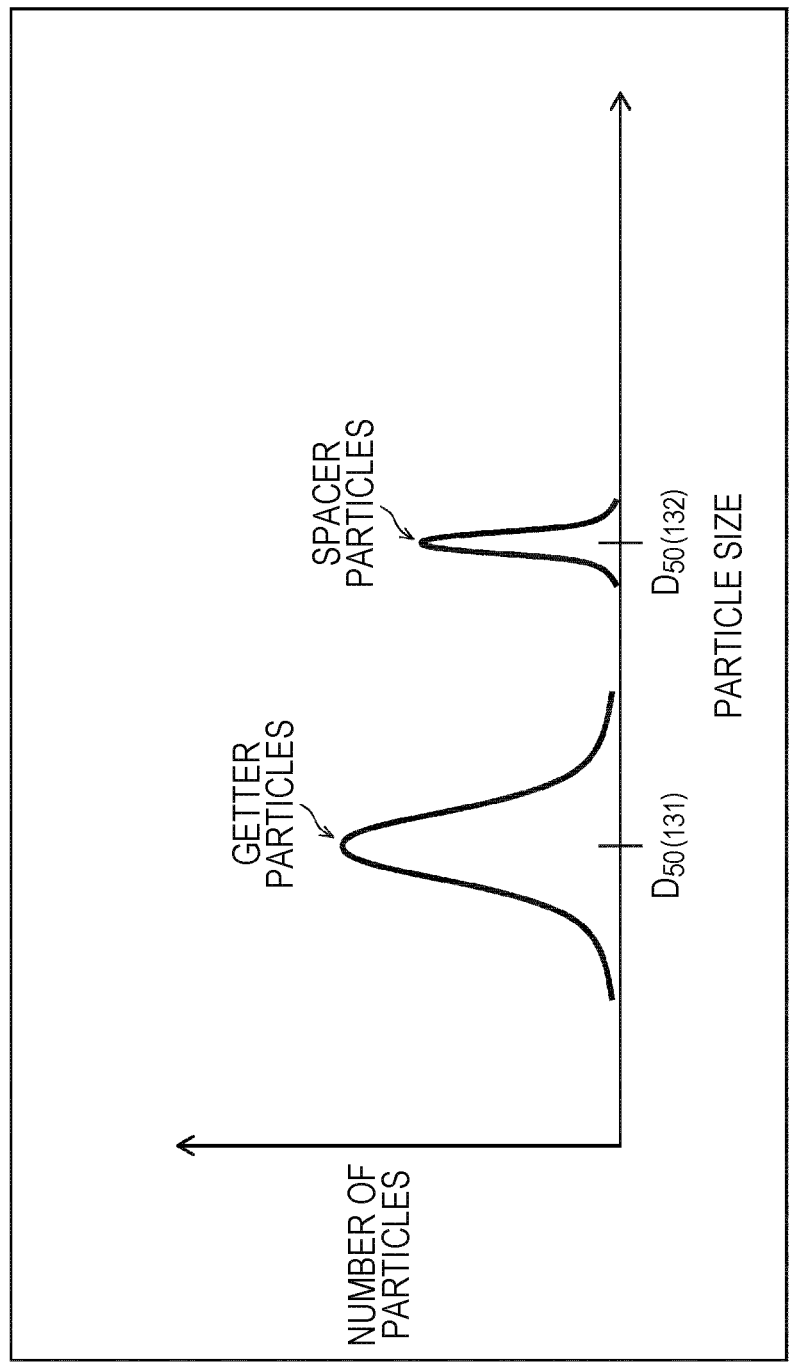
FIG. 7 is a schematic view illustrating particle size distribution of a group consisting of getter particles and a group consisting of spacer particles dispersed in resin layer 13.

As illustrated in FIG. 7, an average particle size $D50_{(131)}$ of getter particles 131 and an average particle size $D50_{(132)}$ of spacer particles 132 satisfy the following relationship.

$$D50_{(132)} > D50_{(131)} \qquad \text{[Expression 1]}$$

Although detailed illustration is omitted in FIG. 7, particle size distribution of getter particles 131 and particle size distribution of spacer particles 132 do not overlap substantially. More specifically, D99 of getter particles 131 has a value lower than a value of D99 of spacer particles 132. Here, a dynamic light scattering method (laser light scattering method) is employed as a method for measuring particle sizes (diameter of particles). In measurement of particle sizes by another method, it is possible to perform conversion with the dynamic light scattering method employed in the present aspect.

Figure 8:
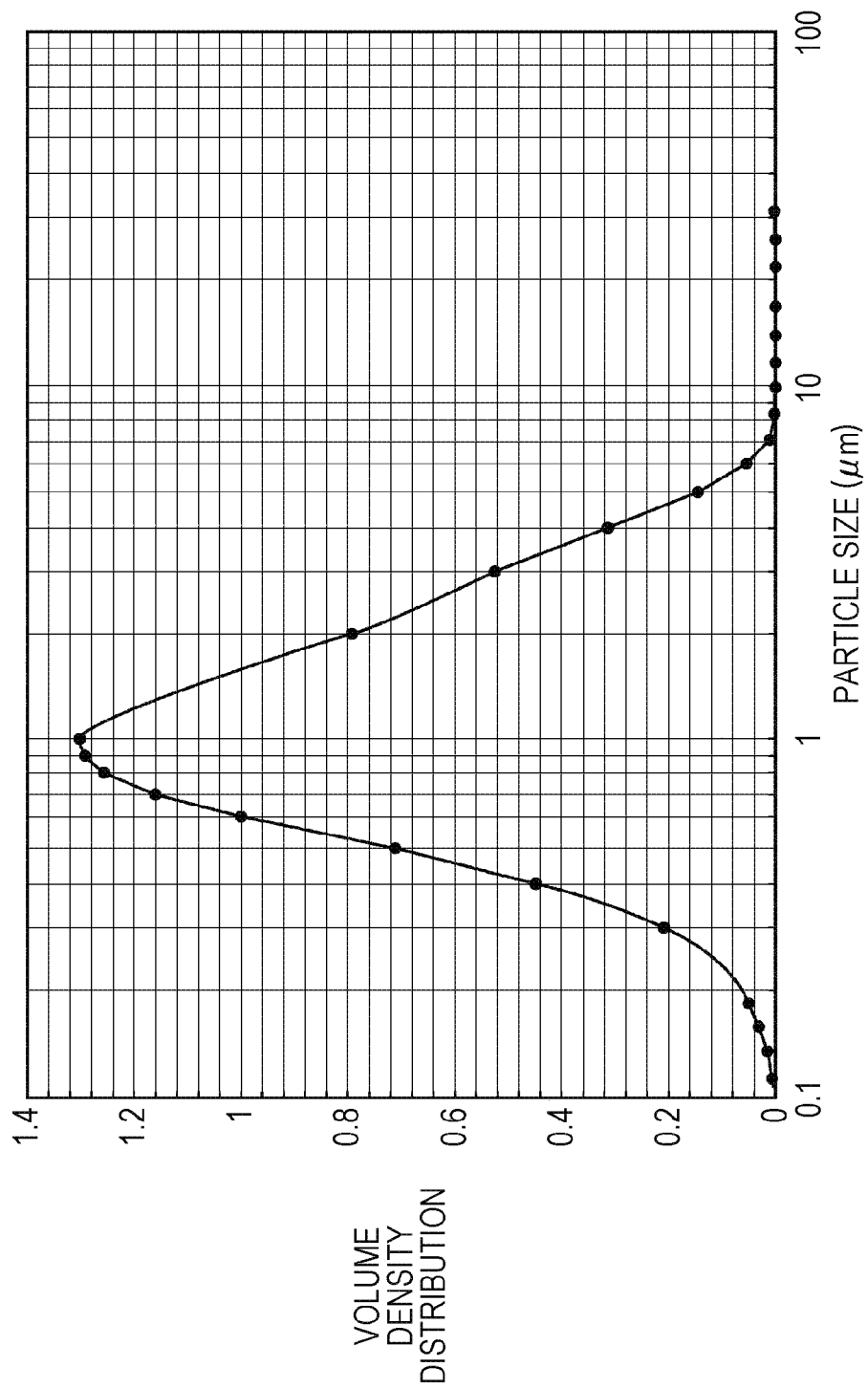
FIG. 8 is a graph illustrating particle size distribution of getter particles 131 contained in resin layer 13.

The particle size distribution of getter particles 131 is illustrated in FIG. 8. However, the average particle size $D50_{(131)}$ of getter particles 131 only needs to satisfy the following relationship.

$$0.4\ \mu m \leq D50_{(131)} \leq 10\ \mu m \qquad \text{[Expression 2]}$$

More preferably, the average particle size $D50_{(131)}$ satisfies the following relationship.

$$3\ \mu m \leq D50_{(131)} \leq 10\ \mu m \qquad \text{[Expression 3]}$$

On the other hand, the average particle size $D50_{(132)}$ of spacer particles 132 only needs to satisfy the following relationship.

$$1\ \mu m \leq D50_{(132)} \leq 100\ \mu m \qquad \text{[Expression 4]}$$

More preferably, the average particle size $D50_{(132)}$ satisfies the following relationship.

$$5\ \mu m \leq D50_{(132)} \leq 30\ \mu m \qquad \text{[Expression 5]}$$

Furthermore, spacer particles 132 preferably satisfy the following relationship from a viewpoint of preventing local load from being applied to spacer particles 132 during panel lamination.

$$Cv_{(132)} \leq 3\% \qquad \text{[Expression 6]}$$

Here, $Cv_{(132)}$ is (standard deviation/average particle size) in the particle size distribution of spacer particles 132.

In addition, regarding spacer particles 132, it is preferable that 10% compressive modulus of elasticity be within a range from 2 GPa to 6 GPa. This is from a viewpoint of controlling damage to organic layers when spacer particles 132 are sandwiched between panels as in FIG. 6B. Furthermore, solid content concentration in spacer particles 132, which is not particularly limited, is preferably within a range from 0.05 wt % to 5 wt % of overall dispersion liquid, and more preferably from 0.1 wt % to 2 wt %, for example.

Next, a relationship between the refractive index $n_{(131)}$ of getter particles 131 and the refractive index $n_{(132)}$ of spacer particles 132 satisfies the following relationship, relative to the refractive index $n_{(130)}$ of resin part 130.

$$|n_{(131)} - n_{(130)}| > |n_{(132)} - n_{(130)}| \qquad \text{[Expression 7]}$$

For example, in the present exemplary embodiment, since an epoxy-based resin material that is the same as a component of resin part 130 are used as a component of spacer particles 132, a relationship of $n_{(132)} \approx n_{(130)}$ is satisfied. Therefore, the relationship of the above [Expression 7] is satisfied.

5. Functions of Getter Particles 131 Performed in Resin Layer 13

Functions of particles 131 performed in resin layer 13 will be described with reference to the drawings from FIG. 9 to FIG. 13B.

(a) Getter Characteristic

Figure 9:
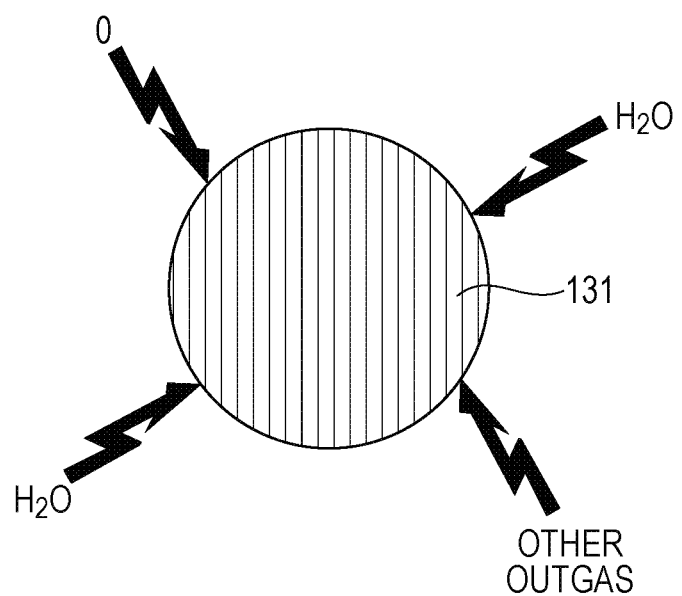
FIG. 9 is a schematic view illustrating how substances such as water are adsorbed by getter particle 131 included in resin layer 13.

In the present exemplary embodiment, particles made of synthetic zeolite are employed as described above, as particles 131 in resin layer 13. Accordingly, as illustrated in FIG. 9, each of getter particles 131 adsorbs components including oxygen ($O_2$) and water ($H_2O$) in resin layer 13. Getter particle 131 adsorbs substances such as water and oxygen included in resin part 130 and other parts, in addition to components, such as water, that enters from outside of display panel 10.

The present inventor has measured water content of resin materials used for formation of resin layer 13 in the organic EL display that is an example of an organic light-emitting device. A result of the measurement shows that the water content generally ranges from 10 ppm to 200 ppm, depending on types of the resin materials to employ.

In addition, it is considered that water from resin layer 13 significantly affects degradation in a light emission characteristic of the organic light-emitting device.

Accordingly, it is considered that, in resin part 130 of resin layer 13, the resin of 1 g contains water of up to some tens of micrograms in the manufacturing process or immediately after manufacture.

Here, a relationship between an adsorption diameter in synthetic zeolite (molecular sieve) and components to be adsorbed is as illustrated in the following table.

TABLE 1

| Type (adsorption diameter) | Components to be adsorbed |
| --- | --- |
| 3A (3 Å = 0.3 nm) | $H_2O$, $NH_3$, He |
| 4A (4 Å = 0.4 nm) | $H_2O$, $NH_3$, $H_2S$, $CO_2$, $C_2H_5$, $C_3H_6$, $CH_3OH$, $C_2H_5OH$, $C_4H_6$ |
| 5A (5 Å = 0.5 nm) | $H_2O$, $NH_3$, $H_2S$, $CO_2$, n-paraffin, n-olefin, n-$C_4H_9OH$ |
| 13X (10 Å = 1.0 nm) | iso-paraffin, iso-olefin, di-n-butylamine aromatic compound |

The present exemplary embodiment employs 5A synthetic zeolite (molecular sieve) in consideration of conditions such as types of outgas and possible components entering from outside.

As described above, from a viewpoint of securing the getter characteristic, the concentration of getter particles 131 in resin layer 13 is preferably equal to or greater than 0.001 wt %. However, it is more preferable that the concentration be equal to or greater than 0.01 wt % depending on the resin material to be used.

However, in order to inhibit the panel from being observed as cloudy arising from scattering of external light, a total surface area of getter particles 131 per 1 $cm^2$ of resin layer 13 is preferably 0.2 $cm^2$ or less. This makes it possible to secure light transmittance of 98% in resin layer 13, and thus a problem of cloudiness is unlikely to occur.

(b) Light Scattering Characteristic

Figure 10A:
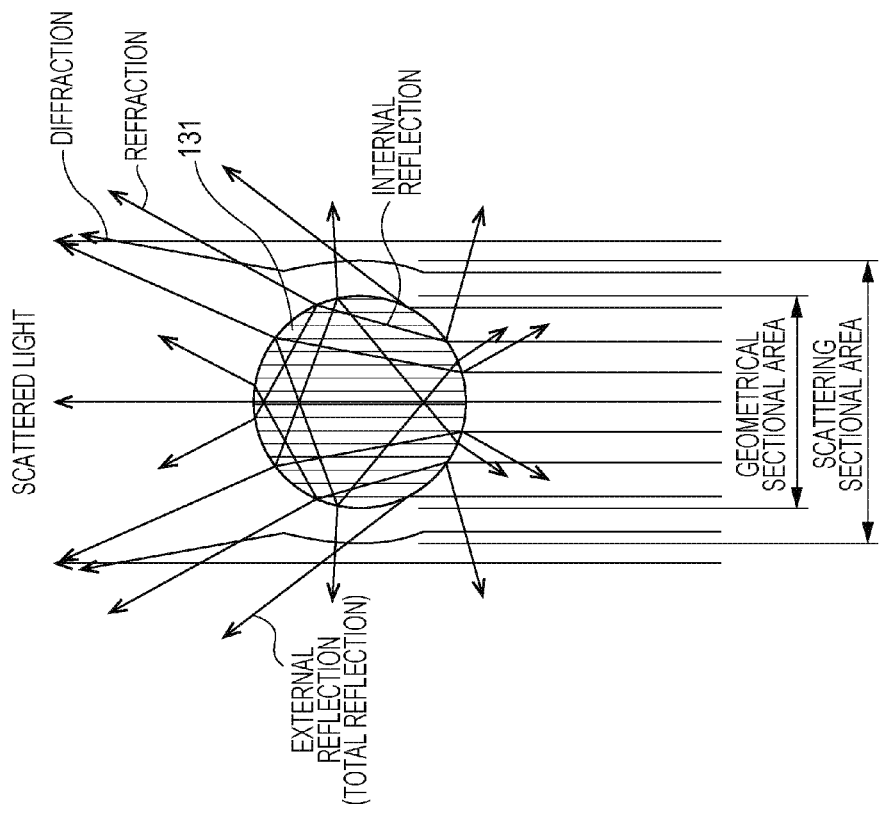
FIG. 10A is a schematic view illustrating a state of refraction of light, etc. when a refractive index of getter particle 131 is larger than a refractive index of a resin part.
Figure 10B:
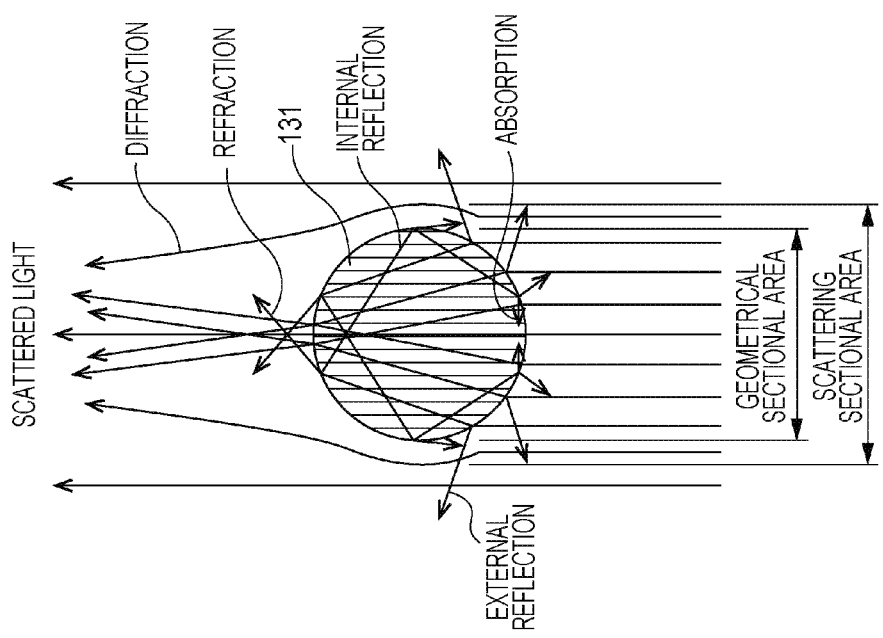
FIG. 10B is a schematic view illustrating a state of refraction of light, etc. when the refractive index of getter particle 131 is smaller than the refractive index of the resin part.

FIG. 10A and FIG. 10B illustrate traveling directions of light scattered by particle 131 in a condition where Mie-Scattering occurs with the particle size D equivalent to or not smaller than the wavelength of the light.

When the refractive index $n_{(131)}$ of getter particle 131 is larger than the refractive index $n_{(130)}$ of resin part 130, the scattering characteristic of light is exhibited as illustrated in FIG. 10A. Although light incident in getter particle 131 is refracted, diffracted, or absorbed, most of the light is scattered forward. Only very small portion of the light is scattered obliquely or backward.

On the other hand, FIG. 10B illustrates the scattering characteristic of light when the refractive index $n_{(131)}$ of getter particle 131 is smaller than the refractive index $n_{(130)}$ of resin part 130. At this time, although forward scattering is dominant as in FIG. 10A, total reflection occurs easily at an interface between resin part 130 and getter particle 131. Accordingly, much of the light is scattered obliquely by external reflection.

Here, the scattering sectional area and the geometrical sectional area are defined as illustrated in FIG. 10A and FIG. 10B.

As illustrated in FIG. 8, the average particle size $D50_{(131)}$ of the plurality of getter particles 131 included in resin layer 13 is approximately 1 µm in the present exemplary embodiment. This particle size is larger than the wavelength of the light emitted from the luminous part. Accordingly, the light emitted onto getter particles 131 in resin layer 13 is Mie-scattered.

Cumulative distribution size D10 of the plurality of getter particles 131 to be dispersed may be 100 nm or more, and cumulative distribution size D90 may be 10 µm or less. A method for measuring the particle sizes is as described above.

Figure 11:
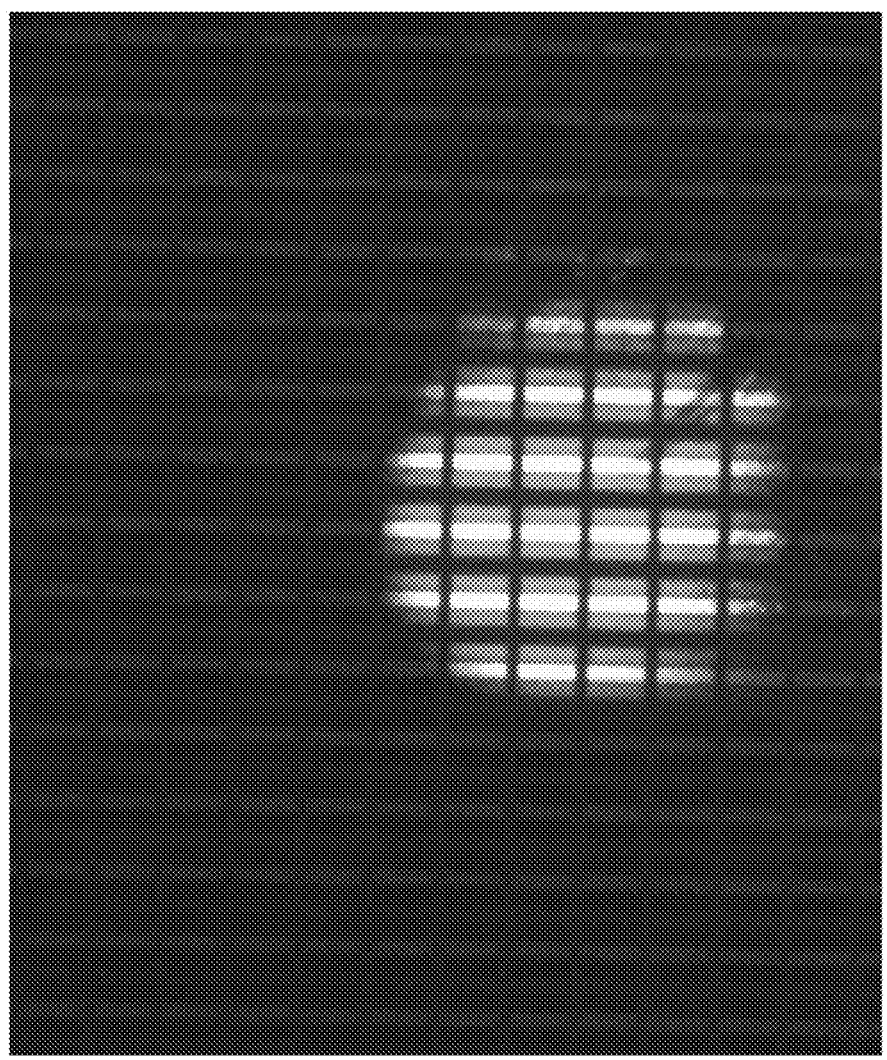
FIG. 11 is an image illustrating a state of external light scattering.

Next, FIG. 11 and FIGS. 12A to 12D illustrate how light is scattered in a panel. A resin layer including getter particles 131 only in a region of approximately 2 mm in diameter is formed inside resin layer 13 that does not include getter particles 131, to observe how light is scattered by getter particles 131. FIG. 11 illustrates a case of turning off EL light emission in the panel and irradiating the panel with external light from an LED light.

FIG. 11 illustrates an observation that only the region where getter particles 131 exist is bright by external light scattering. That is, FIG. 11 illustrates that a large contrast difference occurs by a difference in scattered light between a region where scatterers exist and a region where scatterers do not exist.

In contrast, FIG. 12A to FIG. 12D each illustrate a state where the external light is blocked and the panel is turned on in the region identical to the region illustrated in FIG. 11. FIG. 12A, FIG. 12B, FIG. 12C, and FIG. 12D respectively illustrate the states where only red (R), only green (G), only blue (B), and all colors are turned on. FIG. 12A to FIG. 12D illustrate that scattering by getter particles 131 causes almost no difference in appearance, and that almost no difference in contrast is produced between the region where the scatterers exist and the region where the scatterers do not exist.

With regard to the difference in appearance between FIG. 11 and FIG. 12A to FIG. 12D, FIG. 13A and FIG. 13B illustrate consideration of a mechanism related to emission of light between the case of irradiation with external light and the case of EL light emission, respectively.

First, when the panel is irradiated with light (light from a LED light) from outside as illustrated in FIG. 13A, part of light $L_{11}$ is scattered by getter particle 131, whereas other light $L_{21}$ travels straight to sealing layer 119 as it is. Light $L_{21}$ entering sealing layer 119 travels toward organic luminous layer 116 and anode 112 as it is (light $L_{22}$). Light $L_{11}$ scattered by getter particle 131 is divided into light $L_{12}$ that reaches organic luminous layer 116 and anode 112 through sealing layer 119 as it is, light $L_{13}$ refracted by getter particle 131 and reaching organic luminous layer 116 and anode 112, and light $L_{14}$ reflected externally, traveling through CF panel part 12, and going out. It is considered that, among these types of light, light $L_{14}$ looks cloudy due to external light scattering illustrated in FIG. 11.

On the other hand, light $L_{12}$, light $L_{13}$, and light $L_{22}$ disappear during a path from sealing layer 119 to anode 112, or is reflected by anode 112, then disappears in black matrix layer 122. Accordingly, it is considered that only light $L_{14}$ is highlighted and bright in FIG. 11.

Next, with regard to EL light emission illustrated in FIG. 13B, of light $L_{31}$ and light $L_{41}$ emitted from organic luminous layer 116, light $L_{41}$ is emitted outside through CF panel part 12 (light $L_{42}$). In contrast, light $L_{31}$ is scattered by getter particle 131. Part of $L_{31}$ is emitted outside (light $L_{32}$), while part of $L_{31}$ is refracted or reflected by getter particle 131 (light $L_{33}$, light $L_{34}$, light $L_{35}$, and light $L_{36}$). In Mie-scattering, since most scattered light is scattered forward and becomes light $L_{32}$, a proportion of light (light $L33$, light $L34$, light $L_{35}$, light $L_{36}$) lost by getter particle 131 is extremely small. Therefore, it is considered that a contrast difference is hard to occur, as illustrated in FIG. 12A to FIG. 12D.

Spacer particle 132, which has the refractive index almost identical to the refractive index of resin part 130, seldom causes refraction or reflection even if light enters.

Even when the particle size D is equivalent to or not larger than the wavelength, the scattering sectional area can be reduced. In particular, when the particle size D is 100 nm or less, the scattering sectional area can be reduced so as to be negligible. The light scattering in this range is not Mie-scattering used in the present exemplary embodiment, but is the Rayleigh scattering. In the Rayleigh scattering, the scattering efficiency Qc increases inversely with the wavelength λ to the power of four, and wavelength dependence is stronger. Accordingly, when such a particle is employed in display devices such as the organic EL device, blue color having a short wavelength is scattered more, which causes a color imbalance in blue (B), green (G), and red (R). Therefore, a particle with the particle size D of 100 nm or less is not suitable for the display devices.

In addition, using a particle with the particle size D of 100 nm or less involves a great deal of difficulty from a viewpoint of a process. As the particle size D is reduced, a number of particles increases, distances between the particles become shorter, and a total surface area of the particles increases. Therefore, interparticle interaction (Van der Waals force) increases, and the particles flocculate easily, which is likely to inhibit stable production of the display devices.

6. Particle Size and Concentration of Getter Particles, and Transmittance

A resin layer including getter particles is formed between two transparent glass substrates, and a relationship between particle sizes and concentration of the getter particles, and transmittance are studied. A result of the study will be described with reference to FIG. 14 to FIG. 17. In this study, silica particles are used as the getter particles.

(1) Scattering Angles and Light Intensity of Transmitted Light

Figure 14:
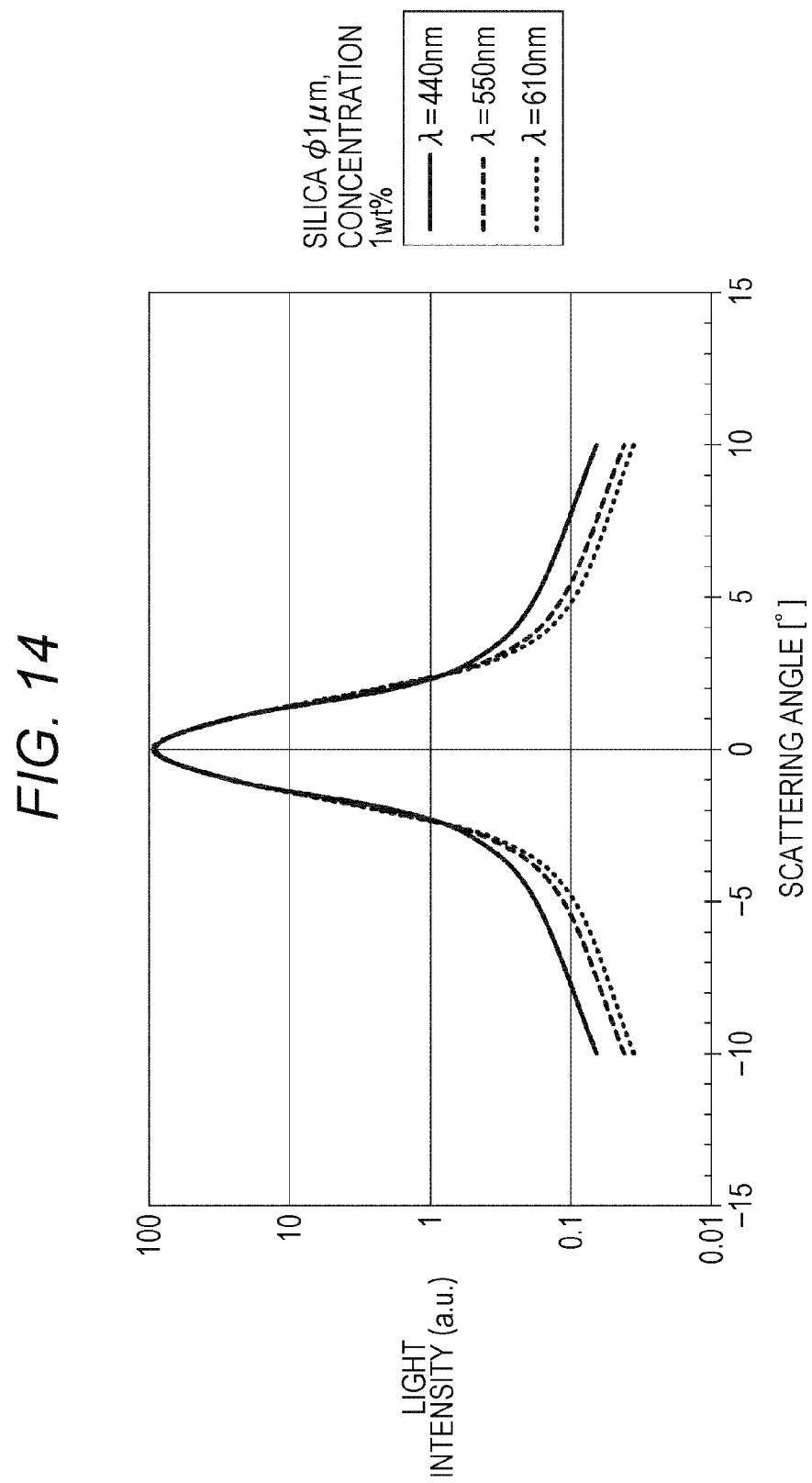
FIG. 14 is a graph illustrating a relationship between scattering angles and light intensity for each wavelength of light.

As illustrated in FIG. 14, a relationship between scattering angles and light intensity of transmitted light is studied, in a case where the particle size D of the getter particles is 1 µm, concentration is 1 wt %, a layer thickness of the resin layer is 15 µm, and incident wavelengths are switched among three types. As illustrated in FIG. 14, it is understood that scattered light is concentrated within 3 degrees, and that most scattered light is scattered forward in Mie-scattering.

It is also understood that, as the wavelength decreases, light is more easily scattered, and a proportion of oblique scattering increases.

(2) Particle Size of Getter Particles and Transmittance

Figure 15A:
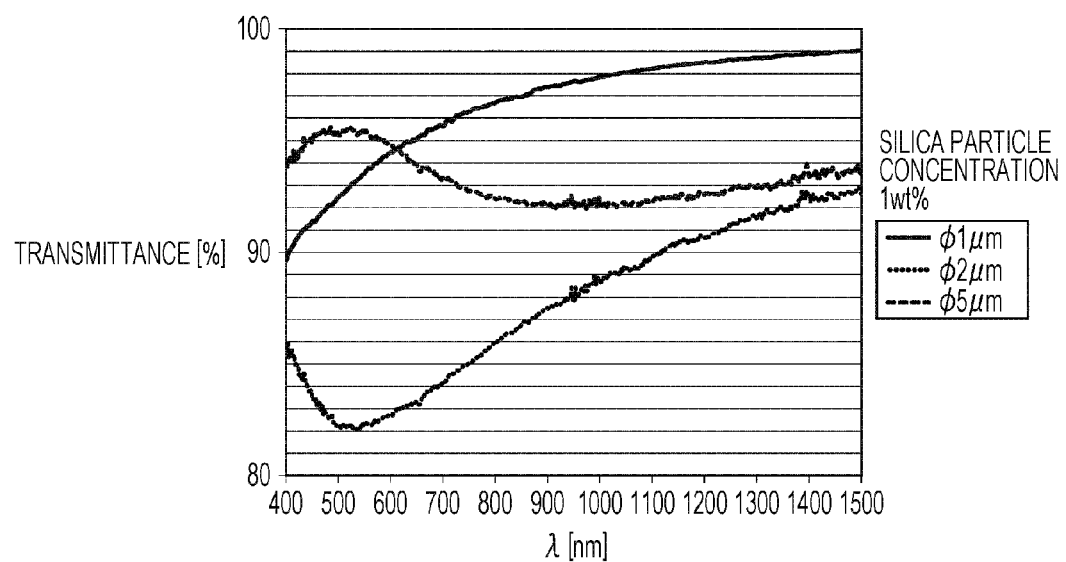
FIG. 15A is a graph illustrating a relationship between wavelengths of light and transmittance for each particle size of getter particles 131.
Figure 15B:
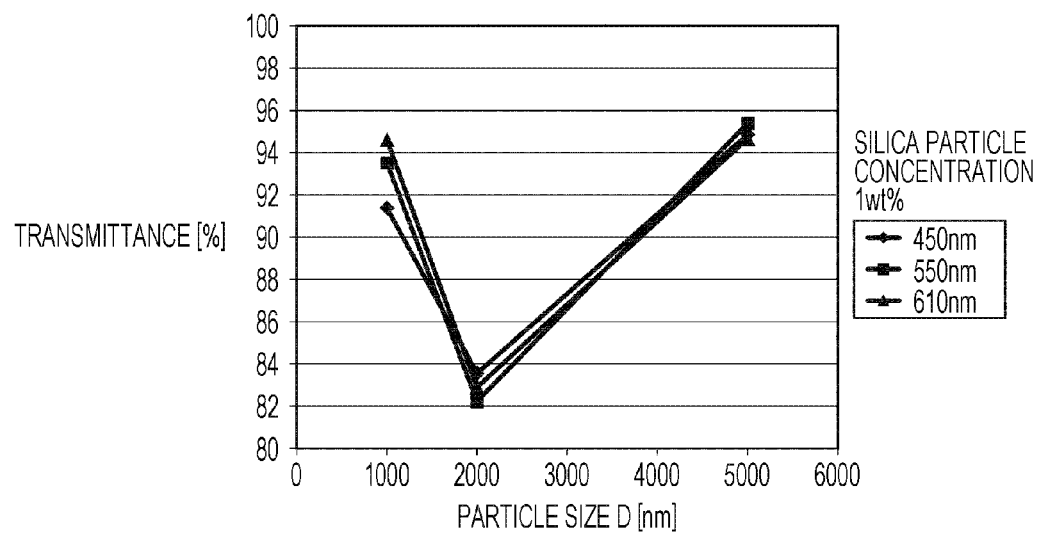
FIG. 15B is a graph illustrating a relationship between the particle size of getter particles 131 and transmittance for each wavelength of light.

FIG. 15A illustrates dependence of intensity of transmitted light on wavelengths in a case where concentration is 1 wt %, the layer thickness of the resin layer is 15 µm, and the particle size D of the getter particles is switched among three types of 1 µm, 2 µm, and 5 µm. FIG. 15B illustrates a relationship between the particle size D and transmittance in blue light (λ=450 nm), green light (λ=550 nm), and red light (λ=610 nm) of visible light wavelengths.

As illustrated in FIG. 15A and FIG. 15B, in the visible light wavelengths, transmittance is lowest when the particle size D is 2 µm, and transmittance increases at 5 µm. Meanwhile, transmittance increases also when the particle size D is 1 µm. As illustrated in FIG. 2A and FIG. 2B, this shows that scattering of light can be reduced in a range where the particle size D exceeds a point of inflection.

This also shows that a difference in transmittance with regard to wavelengths is hard to occur at the particle size D of 5 µm, while wavelength dependence is strong at the particle size D of 1 µm. It is understood that, when the particle size D is 1 µm, light of a visible light range is Mie-scattered, but as the particle size decreases, effects similar to effects of Rayleigh scattering starts to be exhibited.

(3) Concentration and Transmittance

Figure 16:
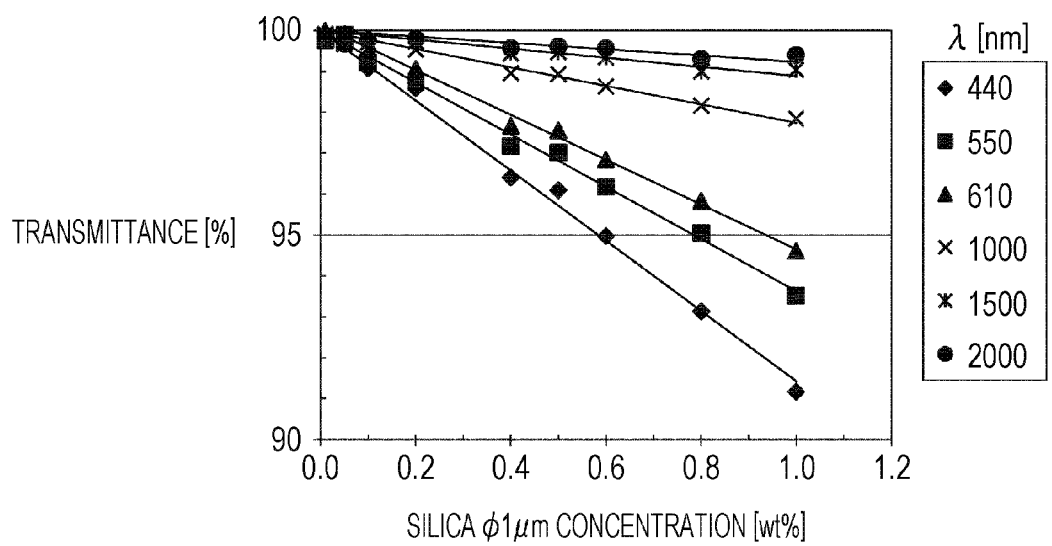
FIG. 16 is a graph illustrating a relationship between concentration of getter particles 131 and transmittance for each wavelength of light.

FIG. 16 illustrates intensity of transmitted light in a case where the particle size D is 1 µm, the layer thickness of the resin layer is 15 µm, and concentration is changed from 0 wt % to 1.0 wt %. As illustrated in FIG. 16, it is understood that transmittance decreases in proportion to concentration of the getter particles and that scattering probability is proportional to the number of getter particles.

In particular, when concentration is 0.2 wt %, transmittance of light with a wavelength of 440 nm can be approximately 98%.

(4) Thickness of Resin Layer and Transmittance

Figure 17:
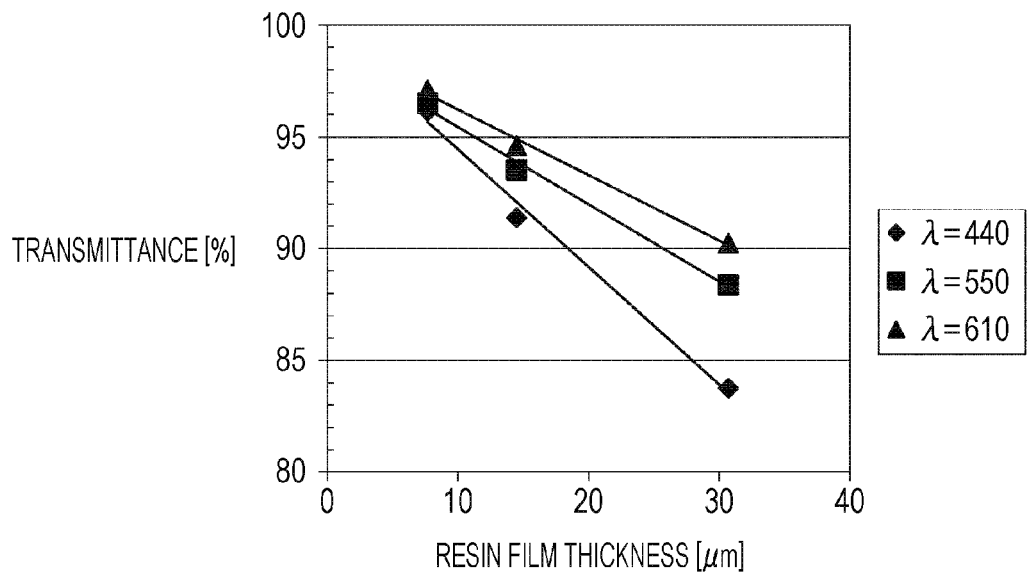
FIG. 17 is a graph illustrating a relationship between a resin film thickness and transmittance for each wavelength of light.

FIG. 17 illustrates a relationship between the layer thickness of the resin layer and intensity of transmitted light when the particle size D is 1 µm. It is understood that transmittance is reduced as the layer thickness of the resin layer increases.

This is considered because the number of particles increases in proportion to the layer thickness of the resin layer.

In particular, when the thickness of the resin layer is 30 µm, transmittance of light with a wavelength of 440 nm decreases to approximately 83%.

On the other hand, when the thickness of the resin layer is 10 µm, transmittance of 96% to 97% can be secured in an entire wavelength range.

Thus, it is understood that, from a viewpoint of improvement in transmittance, a larger particle size D of the getter particles is preferred.

7. Effects Achieved by Display Panel 10 and Organic EL Display Apparatus 1 Including Display Panel 10

(1) Light Emission Characteristic

Effects regarding light emission characteristic of display panel 10 and organic EL display apparatus 1 including display panel 10 will be described with reference to FIG. 18, FIG. 19A, and FIG. 19B.

As illustrated in FIG. 18, also in display panel 10, a dark spot may be produced in which part of a luminous part becomes a nonluminous region. One probable cause is that substances such as water and oxygen entering EL panel part 11 from outside of the panel or from panel components (in particular, resin part 130 in resin layer 13) degrade the organic layer in the manufacturing process or after manufacture of the panel.

A foreign substance sandwiched between the anode and cathode of the EL panel part may cause a defective pixel in the manufacturing process or other processes of the display panel. The defective pixel is produced because the sandwiched foreign substance prevents electric current from flowing across two electrodes partially, causes the electrodes to be in an open state, and inhibits injection of holes and electrons into this region of the organic luminous layer.

Display panel 10 according to the present exemplary embodiment can solve such problems as the above dark spot and defective pixel, by employing resin layer 13 that contains the plurality of getter particles 131 under above-described conditions. That is, employing the structure of resin layer 13 according to the present exemplary embodiment makes it possible to conceal the dark spot, etc., to reduce scattering of light including external light scattering, and to improve transmittance. In addition, dispersing getter particles 131 can inhibit entrance of water into the organic functional layer effectively. In addition, as illustrated in FIG. 18, light emitted from a region around the nonluminous region enters the upper portion of resin layer 13 in the Z-axis direction. Out of light $L_1$ that enters resin layer 13, light $L_2$ that does not enter getter particle 131 travels upward in the Z-axis direction as it is, as described above.

As illustrated in FIG. 19A, in display panel 10 according to the present exemplary embodiment, the nonluminous region in each of subpixels 10a to 10c is inconspicuous, and thus high display quality can be obtained.

On the other hand, in display panel 90 according to a comparative example illustrated in FIG. 19B, the resin layer in each of subpixels 90a to 90c does not contain the above particles. Therefore, if the nonluminous region is produced in each of subpixels 90a to 90c, light is not extracted from above the region, making the region visually conspicuous as dark dots 90d. This brings about degradation in display quality in the comparative example illustrated in FIG. 19B.

The comparative example illustrated in FIG. 19B is a panel in which getter particles are not dispersed in the resin layer.

Returning to FIG. 18, light entering getter particle 131 also travels to region C above the nonluminous region by Mie-scattering (light $L_3$, $L_4$). This Mie-scattered light allows extraction of light also above the nonluminous region in the Z-axis direction. Therefore, in display panel 10 according to the present exemplary embodiment, since resin layer 13 contains the plurality of getter particles 131 each having the above-described particle size, even the dark spot or defective pixel can be made visually inconspicuous, which allows high display quality to be secured.

The plurality of getter particles 131 included in resin layer 13, which are formed of synthetic zeolite having the characteristic of adsorbing substances such as water and oxygen, can physically adsorb water and oxygen entering from outside, and outgas such as water and oxygen from the panel structure. Since the concentration of getter particles 131 in resin layer 13 is specified as described above, it is possible to cause getter particles 131 in resin layer 13 to adsorb water and oxygen sufficiently, while inhibiting the cloudy phenomenon resulting from external light scattering. Therefore, it is possible to effectively inhibit entry of substances such as water and oxygen into each organic layer of EL panel part 11 in display panel 10, which provides high display quality.

(2) Inhibition of Short Circuit, Etc.

In display panel 10 according to the present exemplary embodiment, a particle group of spacer particles 132 is dispersed together with a particle group of getter particles 131 in resin part 130 in resin layer 13. The average particle size $D50_{(131)}$ of getter particles 131 and the average particle size $D50_{(132)}$ Of spacer particles 132 satisfy the relationships such as the above-described [Expression 1]. Therefore, in display panel 10, it is possible to avoid such situations as damage to elements and an electric short circuit, caused by getter particles 131 during lamination of EL panel part 11 and CF panel part 12. That is, as illustrated in FIG. 5, spacer particles 132 having the average particle size larger than the particle size of getter particles 131 and having high elasticity contact surfaces of EL panel part 11 and CF panel part 12. This can inhibit damage to EL panel part 11 and CF panel part 12 caused by getter particles 131.

Figure 20:
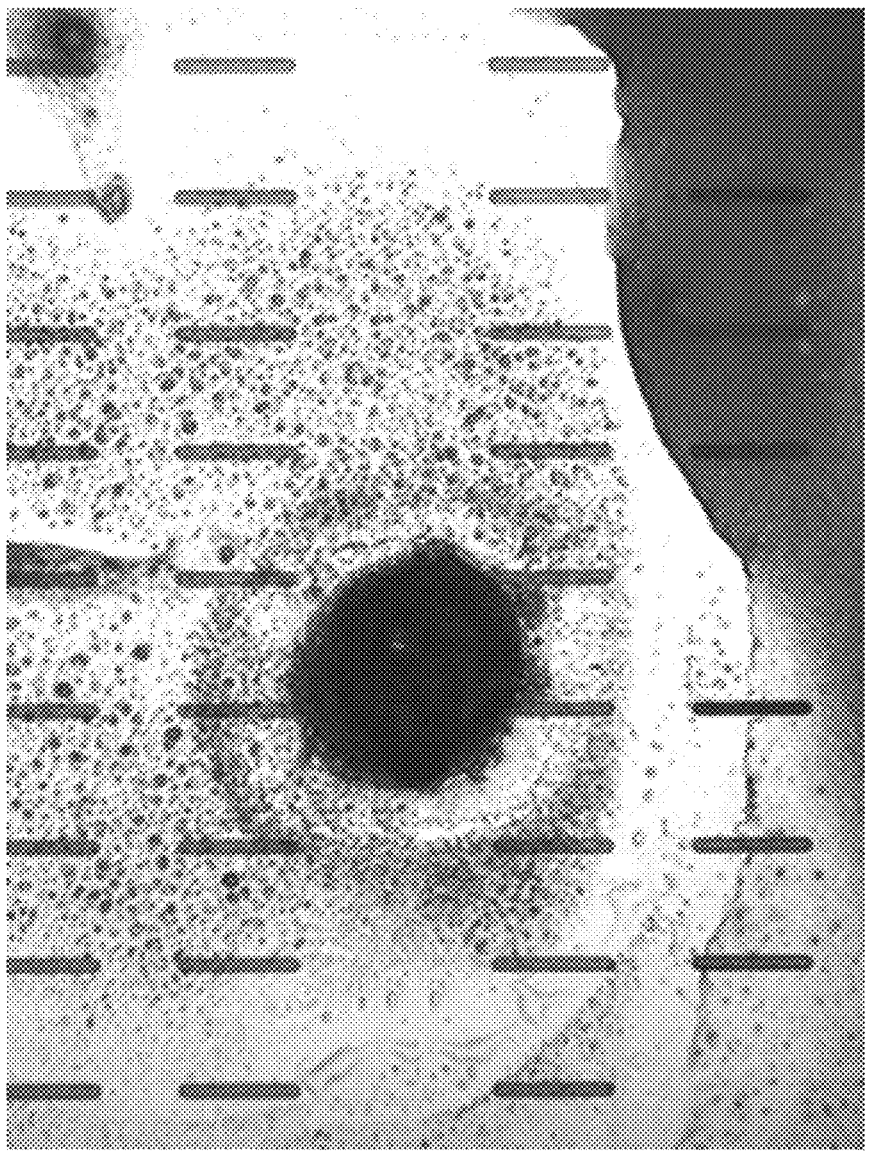
FIG. 20 is a diagram illustrating a short circuit state that can occur if a group consisting of spacer particles is not dispersed in a resin layer as a comparative example.

Absence of spacer particles 132 may cause a problem that getter particles 131 directly contact a luminous element or a wiring part, and cause damage during lamination of EL panel part 11 and CF panel part 12. For example, pushing the luminous element from above causes a short circuit between cathode 118 and anode 112, turning off lighting. Pushing various types of wiring from above may cause a problem that a short circuit occurs in insulating layer (interlayer insulating layer) 111 under anode 112, and that a large electric current flows. FIG. 20 illustrates a situation of a problem in the panel according to the comparative example in which only getter particles 131 are dispersed in the resin layer 13, and spacer particles 132 are not dispersed. As illustrated in FIG. 20, during lamination of EL panel part 11 and CF panel part 12, getter particles 131 pushing the wiring part cause a short circuit between wires, leading to black burns (black spots in FIG. 20).

(3) Summary

As described above, in display panel 10 according to the present exemplary embodiment, the plurality of getter particles 131 are dispersed in resin layer 13. Since the average particle size $D50_{(131)}$ of getter particles 131 satisfies the above-described relationship, it is possible to achieve high light-emission quality and high light-extraction efficiency by inhibiting occurrence of the cloudy phenomenon even when external light enters, while inhibiting functional degradation of the organic functional layer under influence of substances such as water and oxygen entering from outside, and outgas.

The average particle size $D50_{(131)}$ of the plurality of getter particles 131 in resin layer 13 may be set in the range where the particle size $D50_{(131)}$ is equal to or greater than the value of the particle size parameter at which the scattering efficiency Qc becomes maximum in the graph in which the particle size parameter is plotted on the horizontal axis and the scattering efficiency is plotted on the vertical axis, as illustrated in FIG. 1, FIG. 2A, FIG. 2B, and other diagrams.

8. Lamination of EL Panel Part 11 and CF Panel Part 12

Among a method for manufacturing organic EL display apparatus 1 according to the present exemplary embodiment, a process of laminating EL panel part 11 and CF panel part 12 will be described with reference to the drawings from FIG. 21A to FIG. 21C.

Figure 21A:
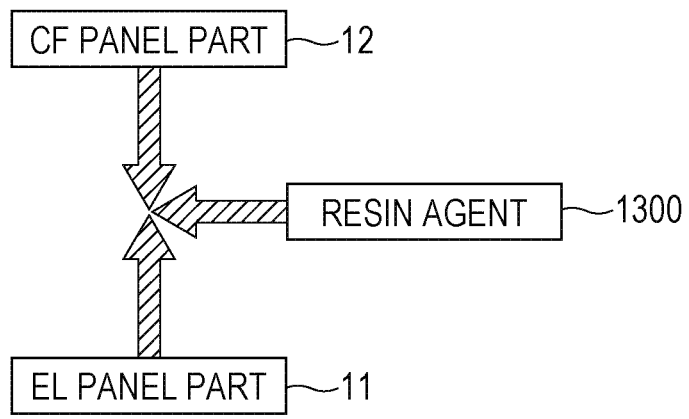
FIG. 21A is a schematic diagram illustrating a process of formation of display panel 10.

First, as illustrated in FIG. 21A, EL panel part 11 and CF panel part 12 are manufactured separately. Apart from these panel parts, resin agent 1300 is prepared. Resin agent 1300 is a material for formation of resin layer 13, and for example, is a material obtained by dispersing and mixing a getter material (for example, synthetic zeolite) and a resin spacer material (for example, an epoxy resin or a divinylbenzene polymer) in an epoxy resin. Concentration of each material to be dispersed is within a range in which the above-described relationships are satisfied for resin layer 13. For example, the getter material is dispersed and mixed so as to have concentration that ranges from 0.01 wt % to 10 wt %. The resin spacer material is dispersed and mixed so as to have concentration that ranges from 0.01 wt % to 1 wt %. The resin spacer material preferably has concentration that ranges from 0.05 wt % to 0.5 wt %.

Resin agent 1300 may be coated on one of EL panel part 11 and CF panel part 12, and may be coated on both.

Figure 21B:
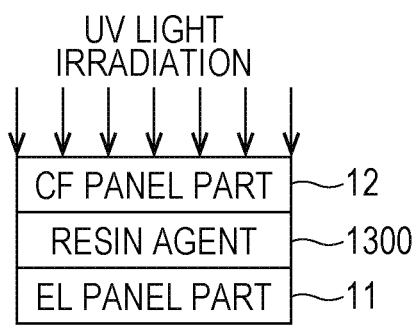
FIG. 21B is a schematic diagram illustrating a process of formation of display panel 10.

Next, as illustrated in FIG. 21B, EL panel part 11 and CF panel part 12 are disposed face-to-face with resin agent 1300 disposed between EL panel part 11 and CF panel part 12. This process is performed under a decompressed atmosphere to prevent air bubbles from remaining between EL panel part 11 and resin agent 1300, and between CF panel part 12 and resin agent 1300. Then, the atmosphere transitions from a decompressed state to an atmospheric pressure state, and resin agent 1300 is irradiated with ultraviolet rays for curing.

Figure 21C:
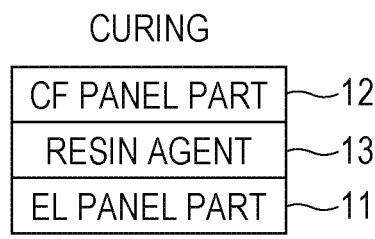
FIG. 21C is a schematic diagram illustrating a process of formation of display panel 10.

As illustrated in FIG. 21C, resin agent 1300 is cured into resin layer 13, and thus lamination of EL panel part 11 and CF panel part 12 is completed.

When a desiccating agent made of alkaline metals or alkaline-earth metals is used as the getter material, adsorption of water changes this desiccating agent into a hydroxide. When the resin layer is a cationic polymerization resin, cations react with the hydroxide and thus inhibit a polymerization reaction. Therefore, until the resin layer is cured, it is preferable to handle these materials under a dry atmosphere, or to increase an amount of polymerization initiator for generating cations in order to minimize adsorption of water by alkaline metals or alkaline-earth metals.

As the resin material, not only materials curable by irradiation with light such as ultraviolet rays, but also a thermosetting resin curable through addition of heat can be employed.

In particular, problems may occur that color filter layers and black matrix layers used in CF substrate 120 shade ultraviolet rays, and that the resin cannot be cured sufficiently. In such a case, it is preferable to employ the thermosetting resin.

[First Variation]

The above-described exemplary embodiment has not described a bank structure in detail. The structure as illustrated in FIG. 22A can be employed as an example.

As illustrated in FIG. 22A, display panel 70 according to First variation includes a plurality of first banks 714 each drawn and formed in a Y-axis direction, and a plurality of second banks 720 each drawn and formed in an X-axis direction. First banks 714 are laminated on upper surfaces of second banks 720.

In display panel 70 according to the present variation, regions surrounded by a pair of adjacent first banks 714 and a pair of adjacent second banks 720 are regions that correspond to subpixels 70a to 70c.

Employing the so-called line bank structure having such a structure facilitates securing flatness of organic films, and provides high display quality.

[Second Variation]

As illustrated in FIG. 22B, in display panel 80 according to Second variation, bank 814 is integrally formed of a plurality of first bank elements 814a each drawn in the Y-axis direction, and a plurality of second bank elements 814b each drawn in the X-axis direction. Regions surrounded by a pair of adjacent first bank elements 814a and a pair of adjacent second bank elements 814b are regions corresponding to subpixels 80a to 80c.

Employing the so-called pixel bank structure having such a structure hardly causes a problem of cross-talk among subpixels 80a to 80c, and provides high display quality.

[Consideration of Getter Particles and Spacer Particles in the Resin Layer]

The above-described exemplary embodiment has described, as an example, the structure in which getter particles 131 and spacer particles 132 are dispersed in at least some region of resin layer 13. Particles to be dispersed in the resin layer that is a coating layer of EL panel part 11 will be considered below.

(1) Getter Particles (Material for the Particles)

In the above-described exemplary embodiment, particles formed of synthetic zeolite (5A) are employed as an example. However, the present disclosure does not limit the material for the getter particles to synthetic zeolite. Besides synthetic zeolite, other materials can also be used, such as aluminum oxide, calcium oxide, calcium chloride, active anhydrous calcium sulfate, magnesium oxide, magnesium perchlorate, magnesium sulfate, phosphorus oxide, potassium carbonate, potassium hydroxide, silica gel, sodium hydroxide, sodium sulfate, and zinc chloride.

The material for the getter particles to be dispersed in the resin layer is not limited to one type. A plurality of types of particles formed of materials different from one another may be dispersed, in consideration of getter characteristic, light scattering characteristic, etc.

It is preferable that ionization energy of a metal that forms the above-described desiccating agent be lower than ionization energy of a metal used for the electron injection layer (or electron transport layer 117). For the electron injection layer (or electron transport layer 117), alkaline metals and alkaline-earth metals are generally used in order to improve electron injection characteristic to the luminous layer. The ionization energy of these metals is extremely large. When the ionization energy of the metal that forms the desiccating agent is lower than the ionization energy of these metals of the electron injection layer (or electron transport layer 117), after the desiccating agent adsorbs water, ions are exchanged between the metal in the desiccating agent and the metal in the electron injection layer (or electron transport layer 117), and the metal in the electron injection layer (or electron transport layer 117) is oxidized. It is more preferable to use, as the desiccating agent, a material like synthetic zeolite that physically adsorbs water.

(Particle Size)

In the above-described exemplary embodiment, getter particles 131 having distribution as illustrated in FIG. 8 are dispersed in resin layer 13 as an example. In the present disclosure, however, similar effects can be obtained when the average particle size D50 is within a range from not less than 0.4 µm and not more than 10 µm.

(Concentration of the Particles)

In the above-described exemplary embodiment, concentration of getter particles 131 in resin layer 13 may be not less than 0.001 wt % and not more than 10 wt % as an example. However, concentration of getter particles 131 is not limited to this example. In relationship with the resin layer, a total surface area of getter particles 131 per 1 cm$^2$ area of the resin layer 13 may be 0.2 cm$^2$ or less.

In addition to light scattering characteristic and getter characteristic, concentration of getter particles 131 is closely related to phenomena such as crack occurrence and cloudiness in the resin layer 13. Therefore, concentration of getter particles 131 may also be specified in detail as follows, in view of preferential characteristic.

(2) Spacer Particles
(Material for the Particles)

Materials that can be used for spacer particles include any of polyethylene, polypropylene, polymethylpentene, polyvinyl chloride, polytetrafluoroethylene, polystyrene, polymethyl methacrylate, polyethylene terephthalate, polybutylene terephthalate, polyamide, polyimide, polysulfone, polyphenylene oxide, polyacetal, an epoxy resin, a phenol resin, a melamine resin, and an unsaturated polyester resin, or any resin that has a bridged structure and is selected from the group consisting of divinylbenzene polymer, divinylbenzene-styrene copolymer, divinylbenzene-acrylic ester copolymer, diallyl phthalate polymer, and triallyl isocyanurate polymer.

(Particle Size)

With regard to the particle size of spacer particles 132, the average particle size D50 may be not less than 1 μm and not more than 100 μm, and more preferably not less than 5 μm and not more than 30 μm.

In addition, the Cv value is preferably 3% or less, from a viewpoint of preventing local load from being applied to spacer particles 132 during lamination of the panels.

(Concentration of the Particles)

In the process of manufacturing the resin layer, concentration of solid content may be not less than 0.05 wt % and not more than 5 wt % of an overall dispersion liquid.

(Other)

With regard to hardness of spacer particles 132, 10% compressive modulus of elasticity within a range from 2 GPa to 6 GPa may be employed from a viewpoint that excessively high hardness prevents reduction in damage to the organic functional layer during lamination of the panels.

[Other Matters]

In the above-described exemplary embodiment and First-Second variations, display panels 10, 70, and 80 are used as an example of the organic light-emitting device, but the present disclosure is not limited to this example. For example, the structure of the present disclosure is also applicable to organic EL lighting, etc.

The above-described exemplary embodiment and First-Second variations employ active-matrix display panels 10, 70, and 80, but the present disclosure is not limited to this example. For example, the above-described exemplary embodiment and First-Second variations are also applicable to passive-matrix display panels.

As illustrated in FIG. 4 and other diagrams, in the above-described exemplary embodiment, a combination of three subpixels 10a to 10c each having a rectangular shape in plan view forms one pixel. However, neither a shape of each subpixel in plan view nor a number of subpixels that form one pixel is limited to this example. For example, the shape of each subpixel in plan view may be a triangle, a hexagon, and an octagon, and may be a honeycomb shape as a whole. The number of subpixels that form one pixel may be four, and may also be four or more. In this case, the subpixels that form one pixel may have luminous colors different from one another, and some subpixels may also emit light in identical color.

In addition, resin layer 13 having the above structure may be disposed in another region. For example, when a resin substrate, etc. is employed as a substrate for EL panel part 11, resin layer 13 may also be disposed between the resin substrate and the TFT layer. Employing such a structure makes it possible to protect the semiconductor layer from outgas and substances from outside such as water and oxygen, for example, even if an organic semiconductor is used as the semiconductor for the TFT layer.

In the above-described exemplary embodiment, the sizes of getter particles 131 and spacer particles 132 dispersed in resin layer 13 are specified with the particle size. However, the particle size can be measured using the dynamic light scattering method (laser light scattering method), for example. The particle sizes can be, of course, measured using another measuring method, and in this case, it is possible to confirm that the particle sizes are within specified range by conversion.

External shapes of getter particle 131 and spacer particle 132 do not need to be perfectly spherical. In this case, it is possible to confirm that the particles are within the range of the particle size by, for example, conversion into volume or surface area.

In the above-described exemplary embodiment, getter particles 131 and spacer particles 132 are dispersed in resin layer 13. However, spacer particles 132 do not necessarily need to be dispersed. Also in this case, getter functions can be obtained, and functions and effects from a viewpoint of transmission of light and reflection of external light can be obtained as described above.

The present disclosure is useful in achieving organic light-emitting devices and organic display apparatuses that have high light-emission quality.

REFERENCE SINGS LIST 1 organic EL display apparatus
10, 70, 80 display panel
10a, 10b, 10c, 70a, 70b, 70c, 80a, 80b, 80c subpixel
11 EL panel part
12 CF panel part
13 resin layer
20 drive-control circuit unit
21 to 24 drive circuit
25 control circuit
110 TFT substrate
111 insulating layer
112 anode
113 hole injection layer
114,814 bank
115 hole transport layer
116 organic luminous layer
117 electron transport layer
118 cathode
119 sealing layer
130 resin part
131 getter particle
132 spacer particle
714 first bank
720 second bank
814a first bank element
814b second bank element
1300 resin agent

What is claimed is:
1. An organic light-emitting device comprising:
a first panel;
a second panel disposed to face the first panel with a gap between the first panel and the second panel; and
a coating layer inserted between the first panel and the second panel so as to contact the first panel and the second panel,
wherein
the first panel comprises a first substrate and a luminous part formed on one main surface of the first substrate, the luminous part comprising an organic layer in structure and emitting light opposite to the first substrate, the coating layer transmits the light from the luminous part, a plurality of first particles are dispersed in at least some region of the coating layer, each of the plurality of the first particles is formed of a material selected from the group consisting of synthetic zeolite, aluminum oxide, calcium oxide, calcium chloride, active anhydrous calcium sulfate, magnesium oxide, magnesium perchlorate, magnesium sulfate, phosphorus oxide, potassium carbonate, potassium hydroxide, silica gel, sodium hydroxide, sodium sulfate, and zinc chloride, the plurality of the first particles constitute a first particle group, a plurality of second particles that constitute a second particle group are also dispersed in at least some region of the coating layer, the plurality of second particles that constitute the second particle group being different from those that constitute the first particle group, the second particles that constitute the second particle group include any of polyethylene, polypropylene, polymethylpentene, polyvinyl chloride, polytetrafluoroethylene, polystyrene, polymethyl methacrylate, polyethylene terephthalate, polybutylene terephthalate, polyamide, polyimide, polysulfone, polyphenylene oxide, polyacetal, an epoxy resin, a phenol resin, a melamine resin, and an unsaturated polyester resin, or a resin that has a bridged structure and is selected from the group consisting of divinylbenzene polymer, divinylbenzene-styrene copolymer, divinylbenzene-acrylic ester copolymer, diallyl phthalate polymer, and triallyl isocyanurate polymer, and a relationship of $D50_{(2)} > D50_{(1)}$ is satisfied, where $D50_{(1)}$ is defined as an average particle size of the plurality of first particles that constitute the first particle group, and $D50_{(2)}$ is defined as an average particle size of the plurality of second particles that constitute the second particle group.

2. The organic light-emitting device according to claim 1, wherein the plurality of particles are included in the at least some region of the coating layer in quantity corresponding to a total surface area per 1 $cm^2$ equal to or less than 0.2 $cm^2$.

3. The organic light-emitting device according to claim 1, wherein a difference in a refractive index between each of the second particles that constitute the second particle group and the resin part is smaller than a difference in a refractive index between each of the first particles that constitute the first particle group and the resin part.

4. The organic light-emitting device according to claim 1, wherein a relationship of 1 µm≤$D50_{(2)}$≤100 µm is satisfied.

5. The organic light-emitting device according to claim 1, wherein a relationship of 5 µm≤$D50_{(2)}$≤30 µm is satisfied.

6. The organic light-emitting device according to claim 1, wherein each of the second particles that constitute the second particle group has 10% compressive modulus of elasticity within a range from not less than 2 GPa to not more than 6 GPa.

7. The organic light-emitting device according to claim 1, wherein transmittance of the light from the luminous part in the coating layer is 98% or more.

8. An organic display apparatus comprising:
a display panel; and
a control-drive circuit connected to the display panel,
wherein
a device structure is an organic light-emitting device comprises:
a first panel;
a second panel disposed to face the first panel with a gap between the first panel and the second panel; and
a coating layer inserted between the first panel and the second panel so as to contact the first panel and the second panel, the first panel comprises a first substrate and a luminous part formed on one main surface of the first substrate, the luminous part comprising an organic layer in structure and emitting light opposite to the first substrate, the coating layer transmits the light from the luminous part, a plurality of first particles are dispersed in at least some region of the coating layer, each of the plurality of the first particles is formed of a material selected from the group consisting of synthetic zeolite, aluminum oxide, calcium oxide, calcium chloride, active anhydrous calcium sulfate, magnesium oxide, magnesium perchlorate, magnesium sulfate, phosphorus oxide, potassium carbonate, potassium hydroxide, silica gel, sodium hydroxide, sodium sulfate, and zinc chloride, the plurality of the first particles constitute a first particle group, a plurality of second particles that constitute a second particle group are also dispersed in at least some region of the coating layer, the plurality of second particles that constitute the second particle group being different from those that constitute the first particle group, the second particles that constitute the second particle group include any of polyethylene, polypropylene, polymethylpentene, polyvinyl chloride, polytetrafluoroethylene, polystyrene, polymethyl methacrylate, polyethylene terephthalate, polybutylene terephthalate, polyamide, polyimide, polysulfone, polyphenylene oxide, polyacetal, an epoxy resin, a phenol resin, a melamine resin, and an unsaturated polyester resin, or a resin that has a bridged structure and is selected from the group consisting of divinylbenzene polymer, divinylbenzene-styrene copolymer, divinylbenzene-acrylic ester copolymer, diallyl phthalate polymer, and triallyl isocyanurate polymer, and a relationship of $D50_{(2)} > D50_{(1)}$ is satisfied, where $D50_{(1)}$ is defined as an average particle size of the plurality of first particles that constitute the first particle group, and $D50_{(2)}$ is defined as an average particle size of the plurality of second particles that constitute the second particle group.

* * * * *